(12) United States Patent
Lee et al.

(10) Patent No.: US 12,745,500 B2
(45) Date of Patent: Sep. 22, 2026

(54) VERTICAL MICRO LIGHT-EMITTING DISPLAY WITH BOTTOM CONTACT ELECTRODE STACKED ON FIRST ELECTRODE

(71) Applicant: Samsung Display Co., Ltd., Yongin-si (KR)

(72) Inventors: Jung An Lee, Yongin-si (KR); Hui Won Yang, Yongin-si (KR); Kyung Rock Son, Yongin-si (KR); Gwang Geun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 369 days.

(21) Appl. No.: 18/486,959

(22) Filed: Oct. 13, 2023

(65) Prior Publication Data

US 2024/0274646 A1 Aug. 15, 2024

(30) Foreign Application Priority Data

Feb. 14, 2023 (KR) ........................ 10-2023-0019259

(51) Int. Cl.

| | |
|---|---|
| ***H10H 29/14*** | (2025.01) |
| ***G09G 3/3233*** | (2016.01) |
| ***H10D 86/00*** | (2025.01) |
| ***H10H 20/819*** | (2025.01) |
| ***H10H 20/821*** | (2025.01) |

(Continued)

(52) U.S. Cl.
CPC ......... *H10H 29/142* (2025.01); *G09G 3/3233* (2013.01); *H10H 20/821* (2025.01); *H10H 20/84* (2025.01); *G09G 2300/0819* (2013.01); *G09G 2300/0842* (2013.01)

(58) Field of Classification Search
CPC .... H10H 29/142; H10H 20/821; H10H 20/84; H10H 20/857; H10H 20/819; H10H 20/832; G09G 3/3233; G09G 2300/0819; G09G 2300/0842; H01L 25/0753; G09F 9/3026; H10D 86/40; H10D 86/411; H10D 86/431
See application file for complete search history.

(56) References Cited

U.S. PATENT DOCUMENTS

| | | | | |
|---|---|---|---|---|
| 2017/0294451 A1* | 10/2017 | Kim | ..................... | H10D 86/451 |
| 2021/0272938 A1* | 9/2021 | Chang | .................. | H10H 20/853 |

(Continued)

FOREIGN PATENT DOCUMENTS

| | | | |
|---|---|---|---|
| CN | 111489658 | A | 8/2020 |
| KR | 2021-0085523 | A | 7/2021 |
| KR | 10-2336709 | B1 | 12/2021 |

*Primary Examiner* — Herve-Louis Y Assouman
(74) *Attorney, Agent, or Firm* — Womble Bond Dickinson (US) LLP

(57) ABSTRACT

Provided are display device and tiled display device including a plurality of display devices. A display device includes a substrate, a first electrode above one surface of the substrate, a contact electrode above the first electrode, and contacting the first electrode, a buffer layer above the contact electrode, an active layer of a thin film transistor above the buffer layer, a gate-insulating layer above the active layer, a gate electrode of the thin film transistor above the gate-insulating layer, and a light-emitting element above the first electrode, and in an element contact hole penetrating the contact electrode, the buffer layer, and the gate-insulating layer.

20 Claims, 26 Drawing Sheets

(51) Int. Cl.

| | |
|---|---|
| ***H10H 20/832*** | (2025.01) |
| ***H10H 20/84*** | (2025.01) |
| ***H10H 20/857*** | (2025.01) |
| ***H10W 90/00*** | (2026.01) |

(56) References Cited

U.S. PATENT DOCUMENTS

2021/0319727 A1* 10/2021 Kim ...................... G09F 9/3026
2022/0392987 A1* 12/2022 Liu .................... H10K 59/1213

* cited by examiner

FIG. 12

100
FS
BS
A'
LBL
BET
CTE
ETD1
SUB
A
DR1
DR2
DR3

FIG. 18

100
PDE1
DCE3
DCE2
DCE1
FS
BS
A'
A
DCNT4
DCNT3
DCNT2
DCNT1
TD2
TCH2
TS2
TG2
TFT2
CCNT3
CCE2
CCNT4
TG1
CAE1
CAE2
Cst
PDE2
HCE3
HCE2
HCE1
HCNT4
HCNT3
HCNT2
HCNT1
LBL
TD1
TCH1
TS1
TFT1
CCNT1
CCE1
CCNT2
BET
CTE
PDE3
LCE1
ETD2
ECNT1
EIF
NSEM
MQW
PSEM
EEL
LE
LCNT3
LCNT2
LCNT1
ETD1
190
180
160
142
141
130
BF
SUB
DR1
DR2
DR3

DPM1
DPM2
LCNT3
LCNT2
LCNT1
PDE3
LCE1
ECNT
CCNT1
CCNT2
CCE1
HCE1
HCNT4
HCNT3
HCNT2
HCNT1
PDE2
HCE3
HCE2
BML
TD1
TCH1
TS1
TG1
TFT1
ETD2
EIF
NSEM
MQW
PSEM
EEL
LE
ETD1
PVX
190
180
160
142
141
130
BF
TFTL
SUB
51
52
53
COV1
COV2
GSUB
GCOV
L
F
F'

VERTICAL MICRO LIGHT-EMITTING DISPLAY WITH BOTTOM CONTACT ELECTRODE STACKED ON FIRST ELECTRODE

CROSS-REFERENCE TO RELATED APPLICATION

This application claims priority to, and benefit of, Korean Patent Application No. 10-2023-0019259 filed on Feb. 14, 2023, in the Korean Intellectual Property Office, the contents of which in its entirety are herein incorporated by reference.

BACKGROUND

1. Field

The present disclosure relates to a display device, and a tiled display device including a plurality of display devices.

2. Description of the Related Art

With the advance of information-oriented society, more demand is placed on display devices for displaying images in various ways. The display device may be a flat panel display device, such as a liquid crystal display, a field emission display and a light-emitting display. A light-emitting display device may include an organic light-emitting display device including an organic light-emitting diode element as a light-emitting element, or a light-emitting diode display device including an inorganic light-emitting diode element, such as a light-emitting diode (LED) as a light-emitting element.

The display device includes a display area in which pixels for displaying an image are arranged, and a non-display area (or bezel area) located around the display area, and in which lines for driving the pixels are located. Recently, a bezel-less display device has been released to increase or maximize the area of the display area.

Accordingly, there has been developed a display device in which the area of a non-display area may be reduced or the area of the non-display area may be completely eliminated by arranging a circuit board and a display driving circuit on the rear surface of a substrate, and by forming a wire on the side surface of the substrate to connect a light-emitting element and the circuit board.

SUMMARY

Aspects of the present disclosure provide a display device and a tiled display device in which a process efficiency and a yield are improved by performing only one surface process of a substrate.

Aspects of the present disclosure also provide a display device and a tiled display device in which a thickness of a panel is reduced or minimized by arranging a light-emitting element to be adjacent to a substrate.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes a substrate, a first electrode above one surface of the substrate, a contact electrode above the first electrode, and contacting the first electrode, a buffer layer above the contact electrode, an active layer of a thin film transistor above the buffer layer, a gate-insulating layer above the active layer, a gate electrode of the thin film transistor above the gate-insulating layer, and a light-emitting element above the first electrode, and in an element contact hole penetrating the contact electrode, the buffer layer, and the gate-insulating layer.

The display device may further include a first interlayer insulating layer above the gate electrode, and a first data conductive layer above the first interlayer insulating layer, and including a first connection electrode connected to the active layer through a first contact hole penetrating the first interlayer insulating layer and the gate-insulating layer, and connected to the contact electrode through a second contact hole penetrating the first interlayer insulating layer and the gate-insulating layer, wherein the element contact hole further penetrates the first interlayer insulating layer.

The display device may further include a first planarization layer above the first data conductive layer, and a second data conductive layer above the first planarization layer, and including a second electrode, wherein the light-emitting element contacts the first electrode and the second electrode.

The light-emitting element may include a first type semiconductor above the first electrode and contacting the first electrode, an active layer above the first type semiconductor, and a second type semiconductor above the active layer and contacting the second electrode.

A minimum distance between the active layer and the substrate in a thickness direction of the substrate may be less than a minimum distance between the first data conductive layer and the substrate in the thickness direction of the substrate.

A width of the second electrode may be greater than a width of the element contact hole.

The display device may further include a second planarization layer above the second data conductive layer, a third data conductive layer above the second planarization layer, and including a first pad electrode penetrating the second planarization layer, and a circuit board above the substrate, and electrically connected to the second electrode through the first pad electrode.

The first data conductive layer may further include a second connection electrode penetrating the first interlayer insulating layer and the gate-insulating layer, wherein the second data conductive layer further includes a third connection electrode penetrating the first planarization layer, wherein the third data conductive layer further includes a second pad electrode penetrating the second planarization layer, and wherein the circuit board is electrically connected to the active layer through the second connection electrode, the third connection electrode, and the second pad electrode.

The first pad electrode may be configured to receive a low potential voltage from the circuit board, wherein the second pad electrode is configured to receive a high potential voltage from the circuit board.

A minimum distance between a top surface of the light-emitting element and the substrate in a thickness direction of the substrate may be greater than a minimum distance between a top surface of the first data conductive layer and the substrate in the thickness direction.

At least a part of the light-emitting element may be at a same level as at least one of the first data conductive layer, the gate electrode, or the active layer.

An entirety of a bottom surface of the light-emitting element may contact the first electrode.

The first electrode may include a transparent conductive material, and wherein the contact electrode includes an opaque conductive material.

A thickness of the contact electrode may be greater than a thickness of the first electrode.

The light-emitting element may be configured to emit light onto another surface of the substrate as a display surface.

The light-emitting element may include a vertical micro light-emitting diode.

According to an aspect of the present disclosure, a tiled display device includes display devices, and a seam between the display devices, wherein, among the display devices, a first display device includes a substrate, a first electrode above one surface of the substrate, a contact electrode above the first electrode, and contacting the first electrode, a buffer layer above the contact electrode, an active layer of a thin film transistor above the buffer layer, a gate-insulating layer above the active layer, a gate electrode of the thin film transistor above the gate-insulating layer, and a light-emitting element above the first electrode, and in an element contact hole penetrating the contact electrode, the buffer layer, and the gate-insulating layer.

The first display device may further include an optical member below another surface of the substrate.

The light-emitting element may include a vertical micro light-emitting diode.

The display devices may be arranged in a matrix form in M (M being a positive integer) rows and N (N being a positive integer) columns.

In accordance with a display device and a tiled display device according to one or more embodiments of the present disclosure, a process efficiency and a yield may be improved by performing only one surface process of a substrate.

In accordance with a display device and a tiled display device according to one or more embodiments of the present disclosure, the thickness of a panel may be reduced or minimized by placing a light-emitting element to be adjacent to a substrate.

However, aspects according to the embodiments of the present disclosure are not limited to those described above and various other aspects are incorporated herein.

BRIEF DESCRIPTION OF THE DRAWINGS

The above and other aspects of the present disclosure will become more apparent by describing in detail embodiments thereof with reference to the attached drawings, in which:

FIGS. 12 to 22 are cross-sectional views sequentially showing a part of one sub-pixel in a method of fabricating a display device according to one or more embodiments;

DETAILED DESCRIPTION

Figure 1:
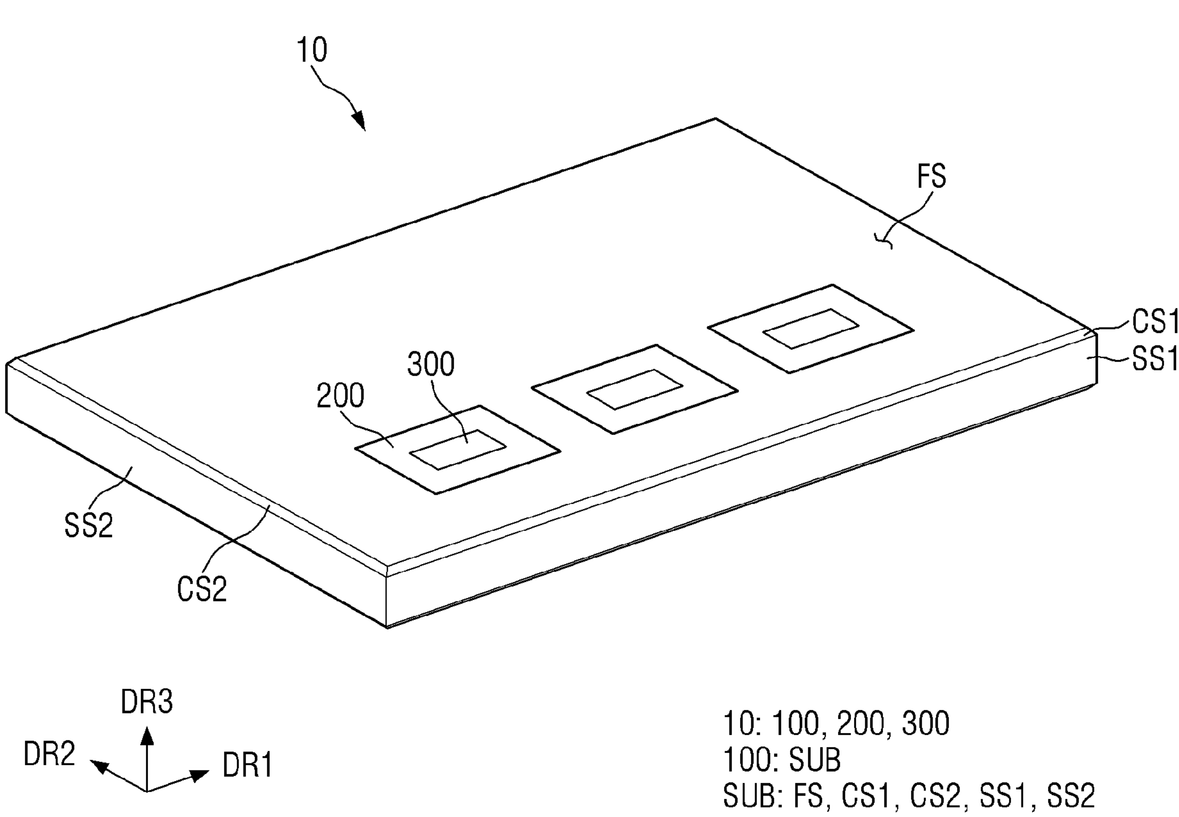
FIG. 1 is a perspective view of a display device according to one or more embodiments viewed from above.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and/or the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
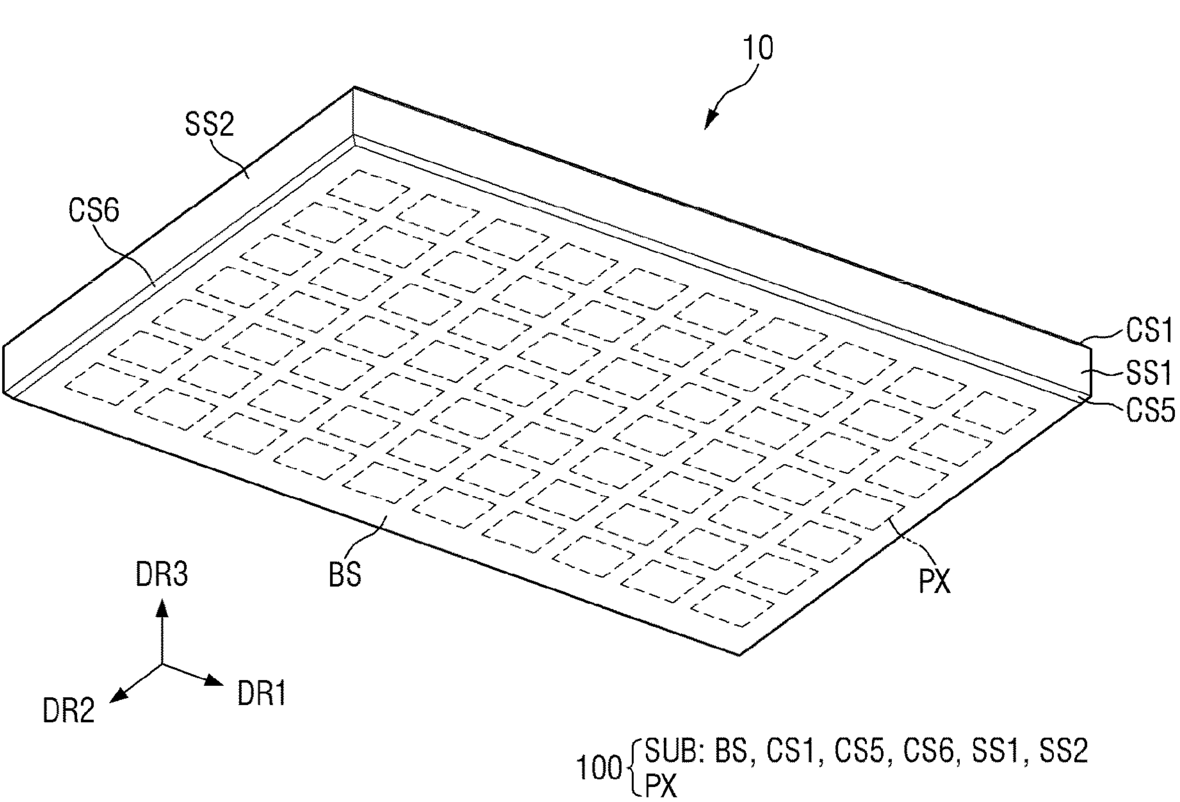
FIG. 2 is a perspective view of a display device according to one or more embodiments viewed from below.

FIG. 1 is a perspective view of a display device according to one or more embodiments viewed from above. FIG. 2 is a perspective view of a display device according to one or more embodiments viewed from below.

Referring to FIGS. 1 to 2, a display device 10 is a device for displaying a moving image or a still image. The display device 10 may be used as a display screen of various devices, such as a television, a laptop computer, a monitor, a billboard and an Internet-of-Things (IOT) device, as well as portable electronic devices, such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 according to one or more embodiments may include a display panel 100, a circuit board 200, and a display driving circuit 300.

The display panel 100 may include a substrate SUB and a plurality of pixels PX. The substrate SUB may include a first surface FS, a second surface BS, a plurality of chamfered surfaces CS1 to CS8, and a plurality of side surfaces SS1 to SS4.

The first surface FS may be the front surface of the substrate SUB. The first surface FS may have a rectangular shape having long sides in the first direction DR1 and short sides in the second direction DR2.

The second surface BS may be a surface opposite to the first surface FS. The second surface BS may be a rear surface, or back surface, of the substrate SUB. The second surface BS may have a rectangular shape having long sides in the first direction DR1 and short sides in the second direction DR2. The second surface BS may be a surface that is opposite to the first surface FS.

In the illustrated figure, the first direction DR1 and the second direction DR2 cross each other as horizontal directions. For example, the first direction DR1 and the second direction DR2 may be orthogonal to each other. In addition, the third direction DR3 crosses the first direction DR1 and the second direction DR2, and may be, for example, substantially perpendicular directions orthogonal to each other.

The plurality of chamfered surfaces CS1 to CS8 indicate obliquely cut surfaces that are located between the first surface FS and the plurality of side surfaces SS1 to SS4, and between the second surface BS and the plurality of side surfaces SS1 to SS4, to reduce or prevent the likelihood of edges becoming sharp after the cutting of the substrate SUB. Due to the plurality of chamfered surfaces CS1 to CS8, it is possible to reduce or minimize the risk of occurrence of cracks during transportation and handling after the cutting of the substrate SUB.

The first chamfered surface CS1 may extend from a first side, for example, a lower side of the first surface FS. The second chamfered surface CS2 may extend from a second side, for example, a left side of the first surface FS. In one or more embodiments, the third chamfered surface CS3 may extend from a third side, for example, an upper side of the first surface FS. In one or more embodiments, the fourth chamfered surface CS4 may extend from a fourth side, for example, a right side of the first surface FS. An interior angle formed between the first surface FS and the first chamfered surface CS1, an interior angle formed between the first surface FS and the second chamfered surface CS2, an interior angle formed between the first surface FS and the third chamfered surface CS3, and an interior angle formed between the first surface FS and the fourth chamfered surface CS4 may be greater than 90 degrees.

The fifth chamfered surface CS5 may extend from a first side, for example, a lower side of the second surface BS. The sixth chamfered surface CS6 may extend from a second side, for example, a left side of the second surface BS. In one or more embodiments, the seventh chamfered surface CS7 may extend from a third side, for example, an upper side of the second surface BS. In one or more embodiments, the eighth chamfered surface CS8 may extend from a fourth side, for example, a right side of the second surface BS. An interior angle between the second surface BS and the fifth chamfered surface CS5, an interior angle formed between the second surface BS and the sixth chamfered surface CS6, an interior angle formed between the second surface BS and the seventh chamfered surface CS7, and an interior angle formed between the second surface BS and the eighth chamfered surface CS8 may be greater than 90 degrees.

The first side surface SS1 may extend from the first chamfered surface CS1. A first chamfered surface CS1 may be located between the first surface FS and the first side surface SS1. The first side surface SS1 may be a lower-side surface of the substrate SUB.

The second side surface SS2 may extend from the second chamfered surface CS2. A second chamfered surface CS2 may be located between the first surface FS and the second side surface SS2. The second side surface SS2 may be a left-side surface of the substrate SUB.

The third side surface SS3 may extend from the third chamfered surface CS3. The third chamfered surface CS3 may be located between the first surface FS and the third side surface SS3. The third side surface SS3 may be an upper-side surface of the substrate SUB.

The fourth side surface SS4 may extend from the fourth chamfered surface CS4. The fourth chamfered surface CS4 may be located between the first surface FS and the fourth side surface SS4. The fourth side surface SS4 may be a right-side surface of the substrate SUB.

The plurality of pixels PX may be located on the second surface BS of the substrate SUB to display an image. The plurality of pixels PX may be arranged in a matrix form in the first direction DR1 and in the second direction DR2. A description of the plurality of pixels PX will be given later with reference to FIG. 3.

In one or more embodiments, the plurality of pixels PX may emit light in a direction in which the second surface BS of the substrate SUB faces. That is, the display device 10 may be a bottom-emission type display device. For example, a light-emitting element LE (see FIG. 5) located in each of the plurality of pixels PX is located on the first surface FS of the substrate SUB, but is located in an element contact hole ECNT1 to be adjacent to the substrate SUB, so that light may be emitted from the rear surface in a direction in which the second surface BS of the substrate SUB faces, that is, in a downward direction in the drawing.

The circuit boards 200 may be located on the first surface FS of the substrate SUB. Each of the circuit boards 200 may be connected to first to third pads PD1, PD2, and PD3 (see FIG. 7) located on the first surface FS of the substrate SUB by using a conductive adhesive member, such as an anisotropic conductive film. The first to third pads PD1, PD2, and PD3 (see FIG. 7) may be electrically connected to thin film transistors TFT1, TFT2, and TFT3 through first to third pad electrodes PDE1, PDE2, and PDE3 and connection electrodes, respectively. The connection relationship between the circuit board 200 and the first to third pads PD1, PD2, and PD3 (see FIG. 7) will be described later with reference to FIGS. 7 to 10.

The circuit boards 200 may each be a flexible printed circuit board, a printed circuit board, or a flexible film, such as a chip on film.

The display driving circuit 300 may output signals and voltages for driving the display panel 100. The display driving circuit 300 may supply data voltages to data lines DL (see FIG. 4). The display driving circuit 300 may supply a power voltage to voltage lines VL1 and VL2 (see FIG. 4), and may supply a gate control signal to a gate driver.

Figure 7:
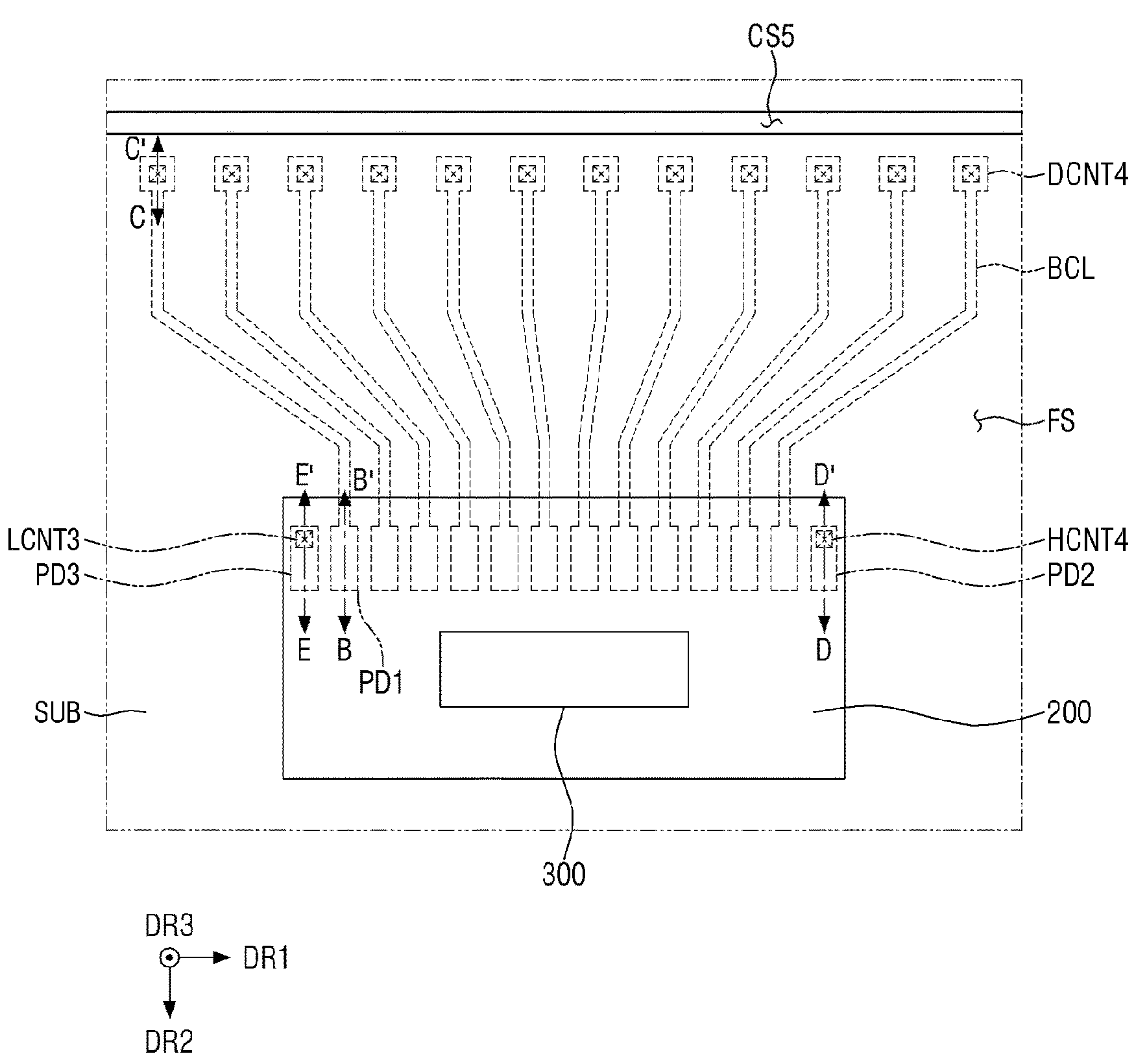
FIG. 7 is a plan view showing one edge of a display device according to one or more embodiments.

For example, the display driving circuit 300 may generate data voltages, and may supply them to the data lines DL (see FIG. 4) through the circuit board 200 and the first pad PD1 (see FIG. 7). For another example, the display driving circuit 300 may generate power voltages, and may supply them to the first voltage lines VL1 (see FIG. 4) through the circuit board 200 and the second pad PD2 (see FIG. 7). For still another example, the display driving circuit 300 may generate power voltages, and may supply them to the second voltage lines VL2 (see FIG. 4) through the circuit board 200 and the third pad PD3 (see FIG. 7).

The display driving circuit 300 may be formed as an integrated circuit (IC) and attached onto the circuit board 200. Alternatively, the display driving circuit 300 may be directly attached to the first surface FS of the substrate SUB by a chip on glass (COG) method.

In the display device 10, all the light-emitting element LE (see FIG. 5), the circuit board 200, and the display driving circuit 300 are located on the same surface of the substrate SUB, for example, the first surface FS, so that a side surface line for electrically connecting different surfaces of the substrate SUB and a passivation layer located on the side surface line may be eliminated. Accordingly, a bezel-less display device may be implemented. Further, because the stacking process is performed on the same surface of the substrate SUB, it is unnecessary to separately perform a side surface process and a rear surface process. Accordingly, a process efficiency and a yield may be improved.

Figure 3:
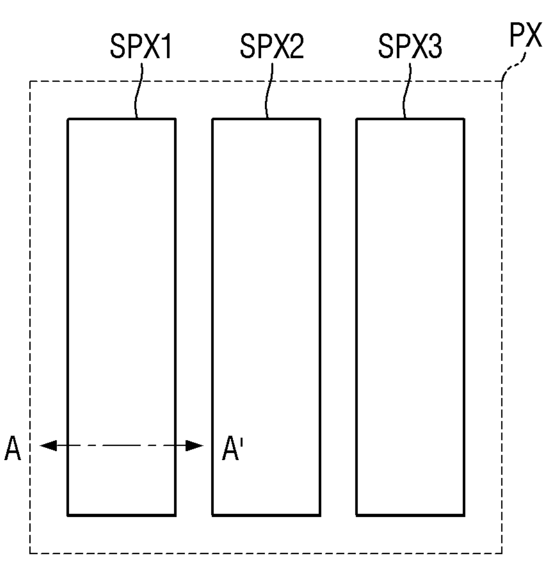
FIG. 3 is a diagram showing an example of a pixel of FIG. 1.
Figure 3:
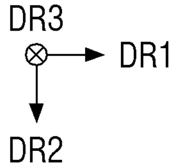

FIG. 3 is a diagram showing an example of a pixel of FIG. 1.

Referring to FIG. 3, each of the pixels PX may include a plurality of sub-pixels SPX1, SPX2, and SPX3. It is illustrated in FIG. 3 that each of the pixels PX includes three sub-pixels SPX1, SPX2, and SPX3 (e.g., a first sub-pixel SPX1, a second sub-pixel SPX2, and a third sub-pixel SPX3), but the present disclosure is not limited thereto. Each of the first sub-pixel SPX1, the second sub-pixel SPX2, and the third sub-pixel SPX3 may be connected to any one of the data lines and at least one of scan lines.

Each of the first sub-pixel SPX1, the second sub-pixel SPX2, and the third sub-pixel SPX3 may have a rectangular, square, or rhombic planar shape. For example, each of the first sub-pixel SPX1, the second sub-pixel SPX2, and the third sub-pixel SPX3 may have a rectangular planar shape with short sides in the first direction DR1, and long sides in the second direction DR2, as shown in FIG. 3. Alternatively, each of the first sub-pixel SPX1, the second sub-pixel SPX2, and the third sub-pixel SPX3 may have a square or rhombic planar shape having sides of the same length in the first direction DR1 and the second direction DR2.

In one or more embodiments, the first sub-pixel SPX1, the second sub-pixel SPX2, and the third sub-pixel SPX3 may be arranged in the first direction DR1. For example, as shown in FIG. 3, the first sub-pixel SPX1, the second sub-pixel SPX2, and the third sub-pixel SPX3 may be sequentially arranged along the first direction DR1. For another example, the first sub-pixel SPX1, the second sub-pixel SPX2, and the third sub-pixel SPX3 may be arranged in the order of the first sub-pixel SPX1, the third sub-pixel SPX3, and the second sub-pixel SPX2, or in the order of the second sub-pixel SPX2, the first sub-pixel SPX1, and the third sub-pixel SPX3, or in the order of the second sub-pixel SPX2, the third sub-pixel SPX3, and the first sub-pixel SPX1, or in the order of the third sub-pixel SPX3, the first sub-pixel SPX1, and the second sub-pixel SPX2, or in the order of the third sub-pixel SPX3, the second sub-pixel SPX2, and the first sub-pixel SPX1.

The first sub-pixel SPX1 may emit a first light, the second sub-pixel SPX2 may emit a second light, and the third sub-pixel SPX3 may emit a third light. Here, the first light may be light of a red wavelength band, the second light may be light of a green wavelength band, and the third light may be light of a blue wavelength band. Although the red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but the present disclosure is not limited thereto.

Each of the first sub-pixel SPX1, the second sub-pixel SPX2, and the third sub-pixel SPX3 may include, as a light-emitting element that emits light, an inorganic light-emitting element having an inorganic semiconductor. For example, the inorganic light-emitting element may be a vertical micro light-emitting diode (LED), but the present disclosure is not limited thereto.

The area of the first sub-pixel SPX1, the area of the second sub-pixel SPX2, and the area of the third sub-pixel SPX3 may be substantially the same as shown in FIG. 3, but the present disclosure is not limited thereto. At least one of the area of the first sub-pixel SPX1, the area of the second sub-pixel SPX2, and/or the area of the third sub-pixel SPX3 may be different from another one thereof. Alternatively, any two of the area of the first sub-pixel SPX1, the area of the second sub-pixel SPX2, and the area of the third sub-pixel SPX3 may be substantially the same, and the other one thereof may be different from the two. Alternatively, the area of the first sub-pixel SPX1, the area of the second sub-pixel SPX2, and the area of the third sub-pixel SPX3 may be different from each other.

Figure 4:
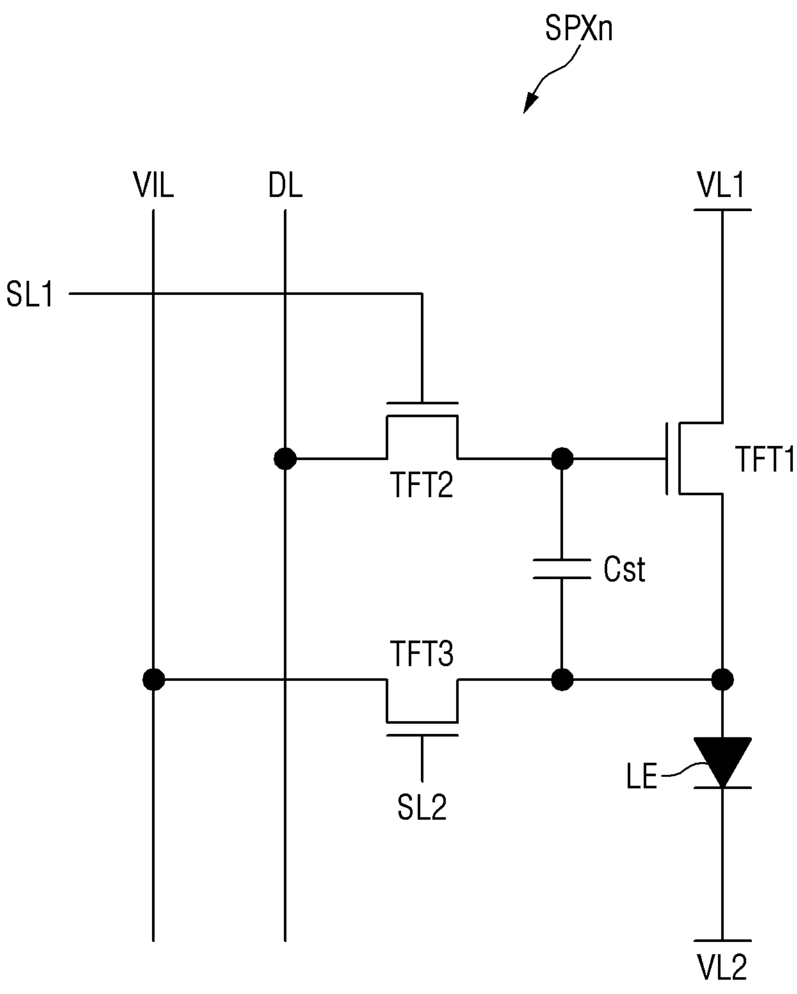
FIG. 4 is an equivalent circuit diagram of a sub-pixel of a display device according to one or more embodiments.

FIG. 4 is an equivalent circuit diagram of a sub-pixel of a display device according to one or more embodiments.

Referring to FIG. 4, each sub-pixel SPXn of the display device 10 according to one or more embodiments may include three thin film transistors TFT1, TFT2, and TFT3 and one storage capacitor Cst in addition to the light-emitting element LE.

The light-emitting element LE may emit light according to a current supplied through the first thin film transistor TFT1. The light-emitting element LE may emit light in a corresponding wavelength band by an electrical signal transmitted from the first electrode and the second electrode.

One end of the light-emitting element LE may be connected to the source electrode of the first thin film transistor TFT1, and the other end thereof may be connected to the second voltage line VL2 to which a low potential voltage (hereinafter, a second power voltage), which is lower than a high potential voltage (hereinafter, a first power voltage) of the first voltage line VL1, is supplied.

The first thin film transistor TFT1 may adjust a current flowing from the first voltage line VL1, to which the first power voltage is supplied, to the light-emitting element LE according to the voltage difference between the gate electrode and the source electrode. For example, the first thin film transistor TFT1 may be a driving transistor for driving the light-emitting element ED. The gate electrode of the first thin film transistor TFT1 may be connected to the source electrode of the second transistor TFT2, the source electrode of the first thin film transistor TFT1 may be connected to the first electrode of the light-emitting element LE, and the drain electrode of the first thin film transistor TFT1 may be connected to the first voltage line VL1 to which the first power voltage is applied.

The second thin film transistor TFT2 is turned on by a scan signal of a first scan line SL1 to connect the data line DL to the gate electrode of the first thin film transistor TFT1. The gate electrode of the second thin film transistor TFT2 may be connected to the first scan line SL1, the source electrode of the second thin film transistor TFT2 may be connected to the gate electrode of the first thin film transistor TFT1, and the drain electrode of the second thin film transistor TFT2 may be connected to the data line DL.

The third thin film transistor TFT3 may be turned on by the scan signal of the second scan line SL2 to connect an initialization voltage line VIL to one end of the light-emitting element LE. The gate electrode of the third thin film transistor TFT3 may be connected to the second scan line SL2, the drain electrode of the third thin film transistor TFT3 may be connected to the initialization voltage line VIL, and the source electrode of the third thin film transistor TFT3 may be connected to one end of the light-emitting element LE and/or to the source electrode of the first transistor TFT1.

In one or more embodiments, the source electrode and the drain electrode of each of the thin film transistors TFT1, TFT2, and TFT3 are not limited to those described above, and vice versa. In FIG. 3, each of the thin film transistors TFT1, TFT2, and TFT3 are formed of an N-type metal oxide semiconductor field effect transistor (MOSFET), but the present disclosure is not limited thereto. For example, each of the thin film transistors TFT1, TFT2, and TFT3 may be formed of a P-type MOSFET. Alternatively, one or more of the thin film transistors TFT1, TFT2, and TFT3 may be formed of an N-type MOSFET, and one or more others may be formed of a P-type MOSFET.

The storage capacitor Cst may be formed between the gate electrode and the source electrode of the first thin film transistor TFT1. The storage capacitor Cst may store the difference voltage between the gate voltage and the source voltage of the first transistor TFT1.

Figure 5:
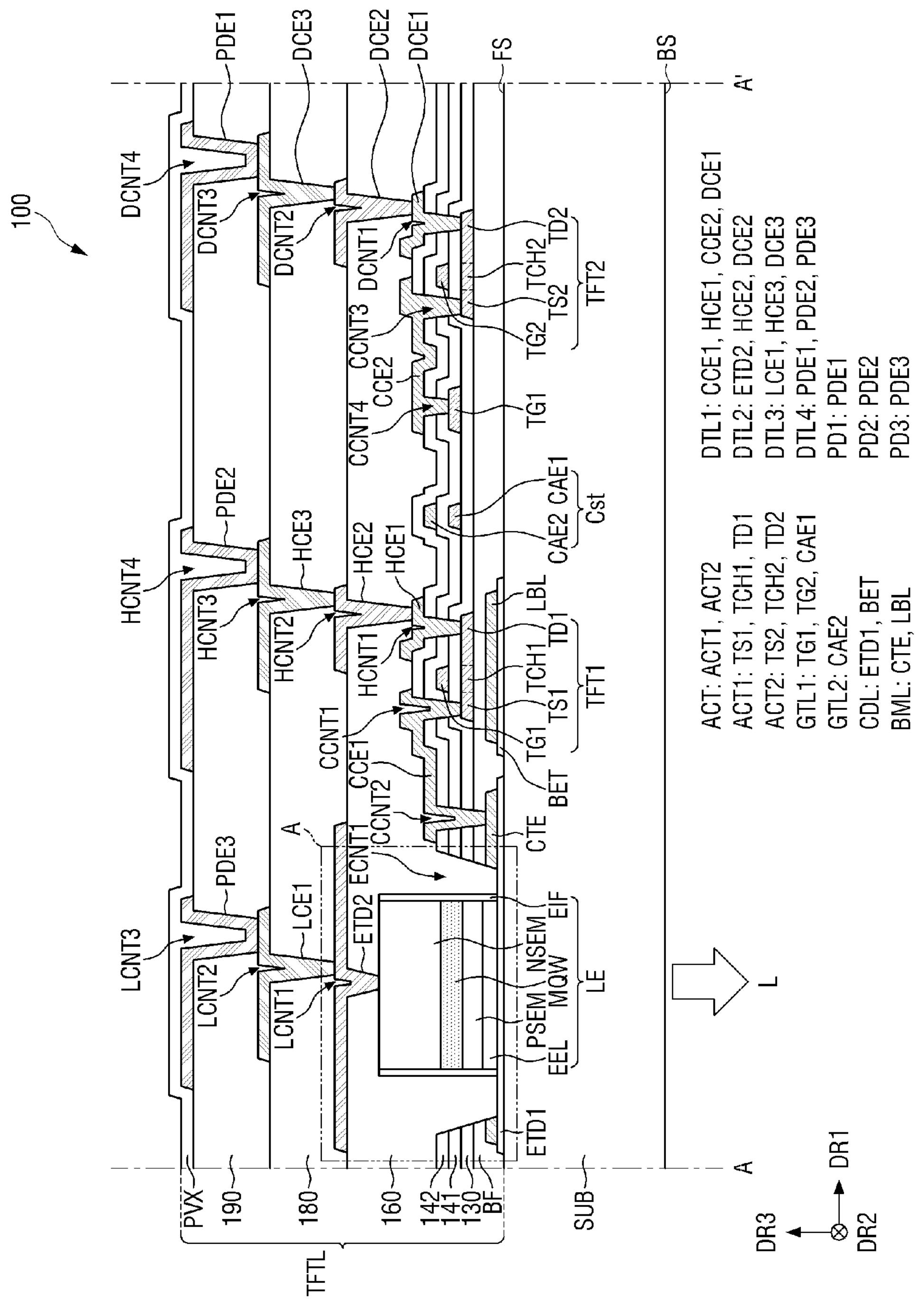
FIG. 5 is a cross-sectional view taken along the line A-A' of FIG. 3.
Figure 6:
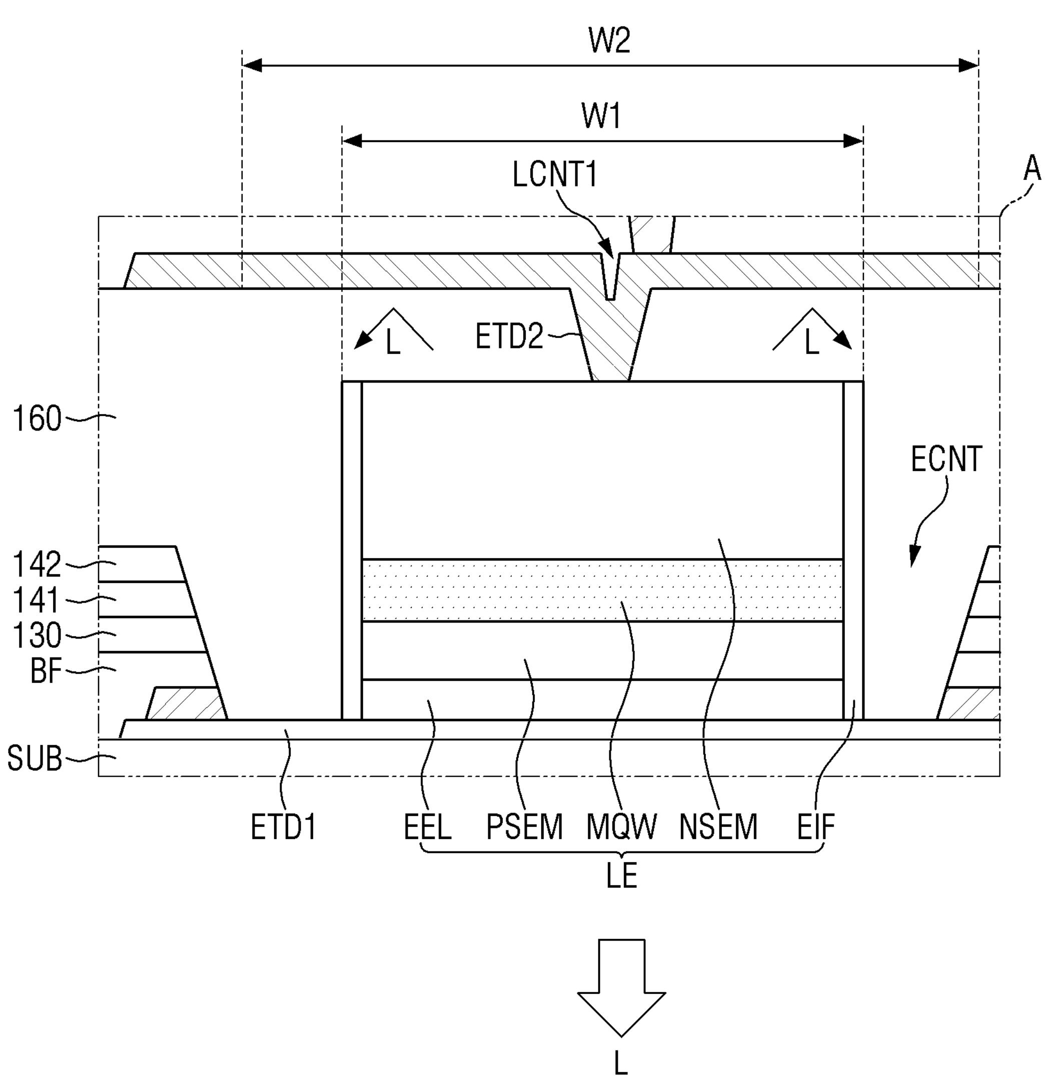
FIG. 6 is an enlarged view of part A of FIG. 5.

FIG. 5 is a cross-sectional view taken along the line A-A' of FIG. 3. FIG. 6 is an enlarged view of part A of FIG. 5. FIG. 5 shows a portion including a light-emitting element, a first thin film transistor, and a second thin film transistor in a sub-pixel.

Referring to FIGS. 5 and 6, the display panel 100 may include the thin film transistor layer TFTL and the light-emitting elements LE located on the substrate SUB. The thin film transistor layer TFTL may be a layer on which the thin film transistors TFT1 and TFT2 are formed.

The thin film transistor layer TFTL may include a first conductive layer CDL, a lower metal layer BML, a semiconductor layer ACT, a first gate layer GTL1, a second gate layer GTL2, a first data metal layer DTL1, a second data metal layer DTL2, a third data metal layer DTL3, and a fourth data metal layer DTL4. In addition, the thin film transistor layer TFTL may include a buffer layer BF, a gate-insulating layer 130, a first interlayer insulating layer 141, a second interlayer insulating layer 142, a first planarization layer 160, a second planarization layer 180, and a third planarization layer 190.

The substrate SUB may be a base substrate or a base member for supporting the display device 10. The substrate SUB may be a rigid substrate made of glass, but the present disclosure is not limited thereto. The substrate SUB may be a flexible substrate that can be bent, folded, or rolled. In this case, the substrate SUB may include an insulating material, such as a polymer resin, such as polyimide (PI).

The first conductive layer CDL may be located on the substrate SUB. The first conductive layer CDL may be made of a transparent conductive oxide, such as indium tin oxide (ITO) and/or indium zinc oxide (IZO).

The first conductive layer CDL may include a first electrode ETD1 and a first lower metal BET.

The first electrode ETD1 may overlap the light-emitting element LE to be described later along the third direction DR3. A light L emitted from the light-emitting element LE may pass through the first electrode ETD1, and may be emitted onto the second surface BS of the substrate SUB, that is, the rear surface.

In one or more embodiments, the first electrode ETD1 may at least partially overlap the light-emitting element LE in a thickness direction. The first electrode ETD1 may at least partially overlap the first thin film transistor TFT1 in the thickness direction.

The first lower metal BET may be located on one side of the first electrode ETD1 in the first direction DR1. The first lower metal BET may overlap a light-blocking layer LBL (to be described later) and the first thin film transistor TFT1 in the third direction DR3.

The lower metal layer BML may be located on the first conductive layer CDL. In one or more embodiments, the lower metal layer BML may be formed as a single layer or as multiple layers made of any one of molybdenum (Mo), aluminum (Al), chromium (Cr), gold (Au), titanium (Ti), nickel (Ni), neodymium (Nd), and/or copper (Cu) or an alloy thereof.

The lower metal layer BML may include a contact electrode CTE and the light-blocking layer LBL.

The contact electrode CTE may be located on the first electrode ETD1. The contact electrode CTE may connect the first electrode ETD1 and a first connection electrode CCE1 to be described later.

In one or more embodiments, the thickness of the contact electrode CTE may be greater than the thickness of the first electrode ETD1. For example, the thickness of the contact electrode CTE may be about 2 to about 10 times the thickness of the first electrode ETD1.

The light-blocking layer LBL may be located on one side of the contact electrode CTE in the first direction DR1. The light-blocking layer LBL may overlap a first active layer ACT1 of the first thin film transistor TFT1. The light-blocking layer LBL may include a material that blocks or reduces light to reduce or prevent light incident on the first active layer ACT1 of the first transistor TFT1. In some embodiments, the light-blocking layer LBL may be omitted.

The buffer layer BF may be located on (e.g., above) the first conductive layer CDL, the lower metal layer BML, and one surface of the substrate SUB. The buffer layer BF may be a layer for reducing or preventing permeation of air or moisture. The buffer layer BF may be formed of a plurality of inorganic layers that are alternately stacked. For example, the buffer layer BF may be formed of multiple layers in which one or more inorganic layers of a silicon nitride layer, a silicon oxynitride layer, a silicon oxide layer, a titanium oxide layer, and/or an aluminum oxide layer are alternately stacked. The buffer layer BF may be omitted.

The semiconductor layer ACT may be located on (e.g., above) the buffer layer BF. The semiconductor layer ACT may include the first active layer ACT1 of the first thin film transistor TFT1, and a second active layer ACT2 of the second thin film transistor TFT2. The first active layer ACT1 and the second active layer ACT2 may respectively partially overlap a first gate electrode TG1 and a second gate electrode TG2 to be described later.

The semiconductor layer ACT may include a silicon semiconductor, such as polycrystalline silicon, monocrystalline silicon, low-temperature polycrystalline silicon, and/or amorphous silicon, or may include an oxide semiconductor. In one or more other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and/or indium gallium zinc tin oxide (IGZTO).

The first active layer ACT1 may include a first channel TCH1, a first source electrode TS1, and a first drain electrode TD1 of the first thin film transistor TFT1. The first channel TCH1 of the first thin film transistor TFT1 may be a region overlapping the first gate electrode TG1 of the first thin film transistor TFT1 in the third direction DR3 that is the thickness direction of the substrate SUB. The first source electrode TS1 of the first thin film transistor TFT1 may be located on one side of the first channel TCH1, and the first drain electrode TD1 thereof may be located on the other side of the first channel TCH1. The first source electrode TS1 and the first drain electrode TD1 of the first thin film transistor TFT1 may be a region that does not overlap the first gate electrode TG1 in the third direction DR3. The first source electrode TS1 and the first drain electrode TD1 of the first thin film transistor TFT1 may be regions having conductivity by doping a silicon semiconductor or an oxide semiconductor with ions.

The second active layer ACT2 may include a second channel TCH2, a second source electrode TS2, and a second drain electrode TD2 of the second thin film transistor TFT2. The second channel TCH2 of the second thin film transistor TFT2 may be a region overlapping the second gate electrode TG2 of the second thin film transistor TFT2 in the third direction DR3 that is the thickness direction of the substrate SUB. The second source electrode TS2 of the second thin film transistor TFT2 may be located on one side of the second channel TCH2, and the second drain electrode TD2 thereof may be located on the other side of the second channel TCH2. The second source electrode TS2 and the second drain electrode TD2 of the second thin film transistor TFT2 may be regions that do not overlap the second gate electrode TG2 in the third direction DR3. The second source electrode TS2 and the second drain electrode TD2 of the second thin film transistor TFT2 may be regions having conductivity by doping a silicon semiconductor or an oxide semiconductor with ions.

The gate-insulating layer 130 may be located on the semiconductor layer ACT. The gate-insulating layer 130 may be formed of an inorganic layer, for example, a silicon nitride layer, a silicon oxynitride layer, a silicon oxide layer, a titanium oxide layer, and/or an aluminum oxide layer.

The first gate layer GTL1 may be located on the gate-insulating layer 130. The first gate layer GTL1 may include the first gate electrode TG1 of the first thin film transistor TFT1, the second gate electrode TG2 of the second thin film transistor TFT2, and a first capacitor electrode CAE1. The first gate layer GTL1 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The first interlayer insulating layer 141 may be located on the first gate layer GTL1. The first interlayer insulating layer 141 may be formed of an inorganic layer, for example, a silicon nitride layer, a silicon oxynitride layer, a silicon oxide layer, a titanium oxide layer, and/or an aluminum oxide layer.

The second gate layer GTL2 may be located on the first interlayer insulating layer 141. The second gate layer GTL2 may include a second capacitor electrode CAE2. The second gate layer GTL2 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The second interlayer insulating layer 142 may be located on the second gate layer GTL2. The second interlayer insulating layer 142 may be formed of an inorganic layer, for example, a silicon nitride layer, a silicon oxynitride layer, a silicon oxide layer, a titanium oxide layer, and/or an aluminum oxide layer.

The first data metal layer DTL1 may be located on the second interlayer insulating layer 142. The first data metal layer DTL1 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The first data metal layer DTL1 may include first connection electrodes CCE1, HCE1, CCE2, and DCE1. The first connection electrodes CCE1, HCE1, CCE2, and DCE1 of the first data metal layer DTL1 may be respectively connected to other layers located under the first data metal layer DTL1 through first contact holes CCNT1, CCNT2, HCNT1, CCNT3, CCNT4, and DCNT1. In this specification, the first connection electrodes CCE1, HCE1, CCE2, and DCE1 included in the first data metal layer DTL1 may be collectively referred to as the connection electrode(s). Further, the first contact holes CCNT1, CCNT2, HCNT1, CCNT3, CCNT4, and DCNT1 through which the first connection electrodes CCE1, HCE1, CCE2, and DCE1 respectively pass may be collectively referred to as the first contact hole(s).

For example, the first connection electrode CCE1 may electrically connect the first source electrode TS1 of the first thin film transistor TFT1 and the contact electrode CTE through the first contact hole CCNT1 penetrating the gate-insulating layer 130, the first interlayer insulating layer 141, and the second interlayer insulating layer 142, and through the first contact hole CCNT2 penetrating the buffer layer BF, the gate-insulating layer 130, the first interlayer insulating layer 141, and the second interlayer insulating layer 142. Further, the first connection electrode HCE1 may electrically connect the first drain electrode TD1 of the first thin film transistor TFT1 and a second connection electrode HCE2 (to be described later) through the first contact hole HCNT1 penetrating the gate-insulating layer 130, the first interlayer insulating layer 141, and the second interlayer insulating layer 142. Further, the first connection electrode CCE2 may electrically connect the second source electrode TS2 of the second thin film transistor TFT2 and the first gate electrode TG1 of the first thin film transistor TFT1 through the first contact hole CCNT3 penetrating the gate-insulating layer 130, the first interlayer insulating layer 141, and the second interlayer insulating layer 142, and through the first contact hole CCNT4 penetrating the first interlayer insulating layer 141 and the second interlayer insulating layer 142. Further, the first connection electrode DCE1 may electrically connect the second drain electrode TD2 of the second thin film transistor TFT2 and a second connection electrode DCE2 (to be described later) through the first contact hole DCNT1 penetrating the gate-insulating layer 130, the first interlayer insulating layer 141, and the second interlayer insulating layer 142.

The light-emitting element LE may be located on the first electrode ETD1. The light-emitting element LE may be located on the first electrode ETD1 through, or within, the element contact hole ECNT1 penetrating the buffer layer BF, the gate-insulating layer 130, the first interlayer insulating layer 141, and the second interlayer insulating layer 142. The light-emitting element LE may include an electrode layer EEL, a p-type semiconductor PSEM, an active layer MQW, an n-type semiconductor NSEM, and an element-insulating film EIF.

A vertical type micro LED in which the p-type semiconductor PSEM faces the first electrode ETD1, the n-type semiconductor NSEM faces the second electrode ETD2, and the active layer is located between the p-type semiconductor PSEM and the n-type semiconductor NSEM is described as the light-emitting element LE. The p-type semiconductor PSEM, the active layer MQW, and the n-type semiconductor NSEM of the light-emitting element LE may be stacked along a vertical direction, that is, the third direction DR3.

In the case of using the vertical type light-emitting element LE, a base substrate for stacking a semiconductor, such as a sapphire substrate, may be omitted in the light-emitting element LE. Accordingly, the light-emitting element LE may solve the problem of element performance degradation caused by the difference between the thermal expansion coefficients of the p-type semiconductor PSEM, the active layer MQW, and the n-type semiconductor NSEM, and the thermal expansion coefficient of a sapphire substrate.

In one or more embodiments, the light-emitting element LE may emit the light L from the active layer MQW using the energy difference generated by the difference between the high potential voltage of the first electrode ETD1 and the low potential voltage of the second electrode ETD2. However, the present disclosure is not limited thereto, and the first electrode ETD1 may have the low potential voltage, and the second electrode ETD2 may have the high potential voltage. In this case, the positions of the p-type semiconductor PSEM and the n-type semiconductor NSEM of the light-emitting element LE may be reversed.

The light-emitting element LE may have a length of several μm, to several hundreds of μm in each of the first direction DR1, the second direction DR2, and the third direction DR3. For example, the light-emitting element LE may have a length of about 100 μm or less in each of the first direction DR1, the second direction DR2, and the third direction DR.

The electrode layer EEL, the p-type semiconductor PSEM, the active layer MQW, the n-type semiconductor NSEM, and the element-insulating film EIF, which are corresponding components of the light-emitting element LE, will be described later with reference to FIG. 11.

The first planarization layer 160 may be located on the first data metal layer DTL1. The first planarization layer 160 may serve to flatten the stepped portion(s) caused by the semiconductor layer ACT, the first gate layer GTL1, the second gate layer GTL2, the first data metal layer DTL1, and the light-emitting element LE. The first planarization layer 160 may be formed of an organic layer, such as acryl resin, epoxy resin, phenolic resin, polyamide resin, polyimide resin, and/or the like.

The second data metal layer DTL2 may be located on the first planarization layer 160. In one or more embodiments, the second data metal layer DTL2 may be formed as a single layer or as multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The second data metal layer DTL2 may include the second electrode ETD2 and the second connection electrodes HCE2 and DCE2. The second electrode ETD2 and the second connection electrodes HCE2 and DCE2 of the second data metal layer DTL2 may be connected to the light-emitting element LE and the first connection electrodes HCE1 and DCE1 through second contact holes LCNT1, HCNT2, and DCNT2, respectively. In this specification, the second connection electrodes HCE2 and DCE2 included in the second data metal layer DTL2 may be collectively referred to as the connection electrode(s). Further, the second contact holes LCNT1, HCNT2, and DCNT2 through which the second electrode ETD2 and the second connection electrodes HCE2 and DCE2 respectively pass may be collectively referred to as the second contact hole(s).

For example, the second connection electrode HCE2 may electrically connect the first connection electrode HCE1 and a third connection electrode HCE3 (to be described later) through the second contact hole HCNT2 penetrating the first planarization layer 160. Further, the second connection electrode DCE2 may electrically connect the first connection electrode DCE1 and a third connection electrode DCE3 (to be described later) through the second contact hole DCNT2 penetrating the first planarization layer 160. The second electrode ETD2 may electrically connect the light-emitting element LE and a third connection electrode LCE1 (to be described later) through the second contact hole LCNT1 penetrating the first planarization layer 160.

In some embodiments, the second electrode ETD2 may be formed of a metal material having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd), and copper (Cu). The light L emitted from the light-emitting element LE may be reflected from the second electrode ETD2 that is an electrode having high reflectivity, and may be emitted onto the second surface BS of the substrate SUB, that is, the rear surface.

The second planarization layer 180 may be located on the second data metal layer DTL2. The second planarization layer 180 may serve to flatten the stepped portion caused by the second data metal layer DTL2. The second planarization layer 180 may be formed of an organic layer, such as acryl resin, epoxy resin, phenolic resin, polyamide resin, polyimide resin and/or the like.

The third data metal layer DTL3 may be located on the second planarization layer 180. The third data metal layer DTL3 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The third data metal layer DTL3 may include the third connection electrodes LCE1, HCE3, and DCE3. The third connection electrodes LCE1, HCE3, and DCE3 of the third data metal layer DTL3 may be respectively connected to the second electrode ETD2 and the second connection electrodes HCE2 and DCE2 through third contact holes LCNT2, HCNT3, and DCNT3. In this specification, the third connection electrodes LCE1, HCE3, and DCE3 included in the third data metal layer DTL3 may be collectively referred to as the connection electrode. Further, the third contact holes LCNT2, HCNT3, and DCNT3 through which the third connection electrodes LCE1, HCE3, and DCE3 respectively pass may be collectively referred to as the third contact hole(s).

For example, the third connection electrode LCE1 may electrically connect the second electrode ETD2 and the third pad electrode PDE3 (to be described later) through the third contact hole LCNT2 penetrating the second planarization layer 180. The third connection electrode HCE3 may electrically connect the second connection electrode HCE2 and the second pad electrode PDE2 (to be described later) through the third contact hole HCNT3 penetrating the second planarization layer 180. Further, the third connection electrode DCE3 may electrically connect the second connection electrode DCE2 and the first pad electrode PDE1 (to be described later) through the third contact hole DCNT3 penetrating the second planarization layer 180.

The third planarization layer 190 may be located on the third data metal layer DTL3. The third planarization layer 190 may serve to flatten the stepped portion caused by the third data metal layer DTL3. The third planarization layer 190 may be formed of an organic layer, such as acryl resin, epoxy resin, phenolic resin, polyamide resin, polyimide resin and/or the like.

The fourth data metal layer DTL4 may be located on the third planarization layer 190. The fourth data metal layer DTL4 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

The fourth data metal layer DTL4 may include the first pad electrode PDE1, the second pad electrode PDE2, and the third pad electrode PDE3. The first pad electrode PDE1, the second pad electrode PDE2, and the third pad electrode PDE3 of the fourth data metal layer DTL4 may be respectively connected to the third connection electrodes DCE3, HCE3, and LCE1 through fourth contact holes DCNT4, HCNT4, and LCNT3. In this specification, the fourth contact holes DCNT4, HCNT4, and LCNT3 through which the first to third pad electrodes PDE1, PDE2, and PDE3 respectively pass may be collectively referred to as the fourth contact hole.

For example, the first pad electrode PDE1 may be electrically connected to the third connection electrode DCE3 through the fourth contact hole DCNT4 penetrating the third planarization layer 190. The second pad electrode PDE2 may be electrically connected to the third connection electrode HCE3 through the fourth contact hole HCNT4 penetrating the third planarization layer 190. The third pad electrode PDE3 may be electrically connected to the third connection electrode LCE1 through the fourth contact hole LCNT3 penetrating the third planarization layer 190.

The first to third pad electrodes PDE1, PDE2, and PDE3 may be included in the first to third pads PD1, PD2, and PD3, respectively. The first to third pads PD1, PD2, and PD3 including the first to third pad electrodes PDE1, PDE2, and PDE3 may be connected to the circuit board 200 (see FIG. 7) using a plurality of bumps CAM1, CAM2, and CAM3, respectively, which will be described later with reference to FIGS. 7 to 10.

The thin film transistor layer TFTL may further include a passivation layer PVX. The passivation layer PVX may be located on the fourth data metal layer DTL4. The passivation layer PVX may cover at least a part of the top surfaces and the side surfaces of the first pad electrode PDE1, the second pad electrode PDE2, and the third pad electrode PDE3. The passivation layer PVX may be formed of an inorganic layer, for example, a silicon nitride layer, a silicon oxynitride layer, a silicon oxide layer, a titanium oxide layer, or an aluminum oxide layer.

The light-emitting element LE may be located under the first planarization layer 160, the second data metal layer DTL2, the second planarization layer 180, the third data metal layer DTL3, the third planarization layer 190, and the fourth data metal layer DTL4 that will be described later. For example, at least a part of the light-emitting element LE may overlap at least one of the first planarization layer 160, the first data metal layer DTL1, the second interlayer insulating layer 142, the second gate layer GTL2, the first interlayer insulating layer 141, the first gate layer GTL1, the gate-insulating layer 130, the semiconductor layer ACT, the buffer layer BF, and/or the lower metal layer BML on the same horizontal plane. The horizontal plane, which is a plane formed by lines extending along the first and second directions DR1 and DR2, means a plane perpendicular to the third direction DR3.

In the display device 10, the thickness of the display panel 100 may be reduced or minimized by placing the light-emitting element LE to be adjacent to the substrate SUB at least at the same height as the thin film transistor layer TFTL, for example, between the first surface FS of the substrate SUB and the first planarization layer 160. Further, because the light-emitting element LE is located adjacent to the substrate SUB, heat exchange with the outside is actively performed, which is advantageous in heat dissipation.

In one or more embodiments, the entire bottom surface of the light-emitting element LE may be in contact with the first electrode ETD1. Accordingly, the contact area with the first electrode ETD1 is widened, and the heat exchange with the outside is actively performed, which is suitable in heat dissipation.

In some embodiments, the top surface of the light-emitting element LE may be positioned at a level higher than that of the first data conductive layer DTL1. For example, the minimum distance between the top surface of the light-emitting element LE and the substrate SUB in the thickness direction of the substrate SUB, that is, in the third direction DR3, may be greater than the minimum distance between the top surface of the first data conductive layer DTL1 and the substrate SUB in the thickness direction of the substrate SUB. In the display device 10, the length of the second electrode ETD2 in the third direction DR3 may be reduced or minimized by locating the top surface of the light-emitting element LE at a level higher than that of the first data conductive layer DTL1. Accordingly, the side surface area of the second electrode ETD2 in contact with the second contact hole LCNT1 (to be described later) may be reduced or minimized. Because the side surface area of the second electrode ETD2 is reduced or minimized, it is possible to reduce or minimize light reflected from the side surface of the second electrode ETD2 and escaping to a portion other than the second surface BS that is the display surface of the display device 10. As a result, the luminance of the display device 10 may be improved.

In some embodiments, the active layer MQW of the light-emitting element LE may be positioned at a level lower than that of the first data conductive layer DTL1. For example, the minimum distance between the active layer MQW and the substrate SUB in the thickness direction of the substrate SUB, that is, in the third direction DR3, may be less than the minimum distance between the first data conductive layer DTL1 and the substrate SUB in the thickness direction of the substrate SUB. When the active layer MQW of the light-emitting element LE is positioned at a level lower than that of the first data conductive layer DTL1, the amount of the light L escaping to the second surface BS that is the display surface of the display device 10 among the light L emitted from the active layer MQW and reflected from the first data conductive layer DTL1 may increase. As a result, the luminance of the display device 10 may be improved.

Referring to FIG. 6 together, in one or more embodiments, a width W2 of the second electrode ETD2 may be greater than a width W1 of the light-emitting element LE. The second electrode ETD2 that is a reflective electrode may reflect the light L emitted from the light-emitting element LE. For example, the width W2 of the second electrode ETD2 may be about 1.2 to about 2 times greater than the width W1 of the light-emitting element LE. At this time, because the width W2 of the second electrode ETD2 is greater than the width W1 of the light-emitting element LE, the amount of the light L reflected from the second electrode ETD2 and escaping to the second surface BS that is the display surface of the display device 10 may increase. As a result, the luminance of the display device 10 may be improved.

Figure 8:
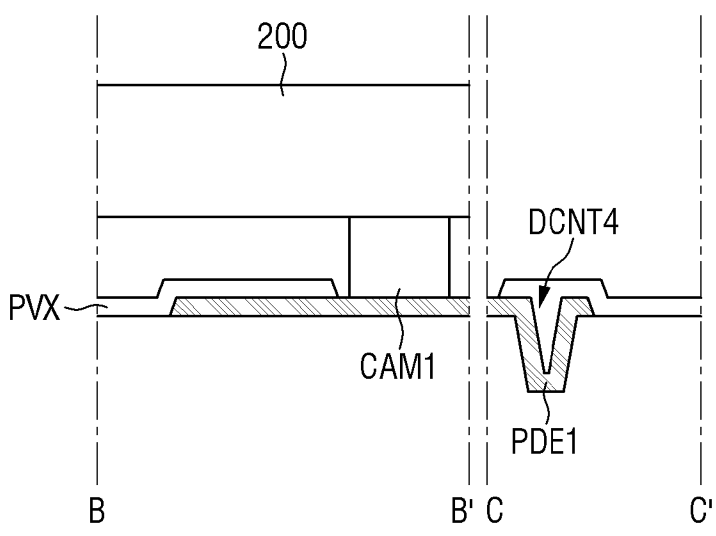
FIG. 8 is a cross-sectional view taken along the line B-B' and along the line C-C' of FIG. 7.
Figure 8:
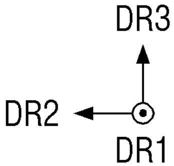
Figure 9:
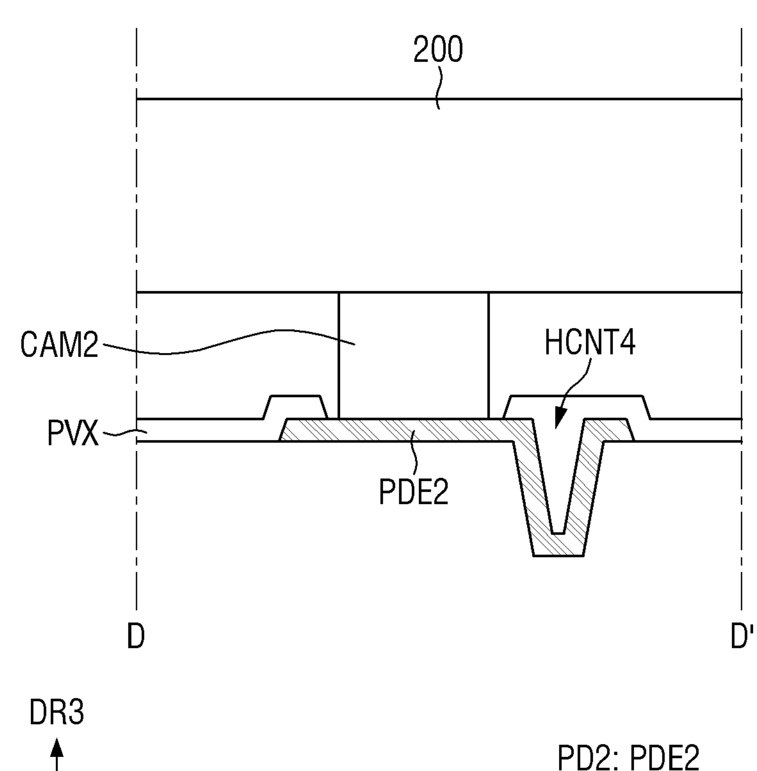
FIG. 9 is a cross-sectional view taken along the line D-D' of FIG. 7.
Figure 10:
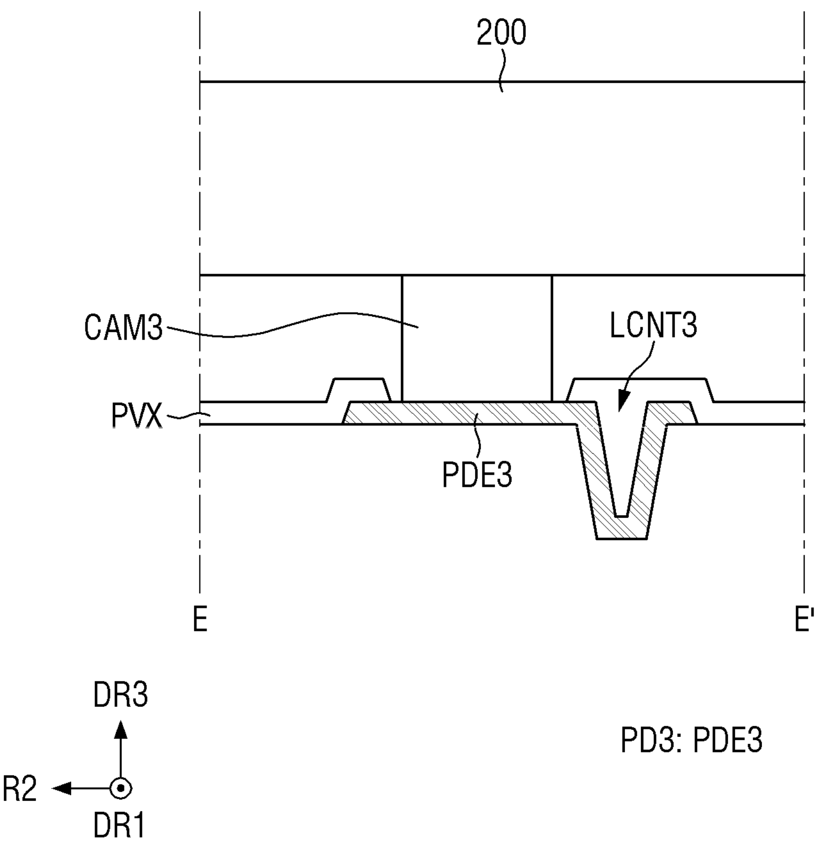
FIG. 10 is a cross-sectional view taken along the line E-E' of FIG. 7.

FIG. 7 is a plan view showing one edge of a display device according to one or more embodiments. FIG. 8 is a cross-sectional view taken along the line B-B' and along the line C-C' of FIG. 7. FIG. 9 is a cross-sectional view taken along the line D-D' of FIG. 7. FIG. 10 is a cross-sectional view taken along the line E-E' of FIG. 7.

Referring to FIGS. 7 to 10 in addition to FIG. 5, the display panel 100 may further include the first pads PD1, the second pad PD2, the third pad PD3, and the connection lines BCL.

The first pads PD1 may be front surface pads located on the first surface FS corresponding to the front surface of the substrate SUB. The first pads PD1 may be arranged in the first direction DR1. The first pads PD1 may include the first pad electrode PDE1.

The first pads PD1 may be connected to, or partially located in, the fourth contact holes DCNT4 arranged along the first direction DR1 through the connection lines BCL. The first pads PD1 may be connected to the second drain electrode TD2 of the second thin film transistor TFT2 through the connection electrodes DCE1, DCE2, and DCE3. The connection lines BCL may include the same first pad electrode PDE1 as that of the first pad PD1.

To connect a larger number of the first pads PD1 to the circuit board 200, the gap between the first pads PD1 adjacent to each other in the first direction DR1 may be less than the gap between the fourth contact holes DCNT4 adjacent to each other in the first direction DR1. Because the gap between the first pads PD1 adjacent to each other in the first direction DR1 and the gap between the fourth contact holes DCNT4 adjacent to each other in the first direction DR1 are different, the connection lines BCL may be bent at least once.

The second pads PD2 may be front surface pads located on the first surface FS corresponding to the front surface of the substrate SUB. The second pads PD2 may be arranged on one side of the first pad PD1 in the first direction DR1. The second pad PD2 may include the second pad electrode PDE2. The second pad PD2 may be connected to, or partially located in, the fourth contact hole HCNT4. The second pad PD2 may be connected to the first drain electrode TD1 of the first thin film transistor TFT1 through the connection electrodes HCE1, HCE2, and HCE3.

The third pads PD3 may be front surface pads located on the first surface FS corresponding to the front surface of the substrate SUB. The third pads PD3 may be arranged on the other side of the first pad PD1 with respect to the first direction DR1. The third pad PD3 may include the third pad electrode PDE3. The third pad PD3 may be connected to, or partially located in, the fourth contact hole LCNT3. The third pad PD3 may be connected to the second electrode ETD2 through the connection electrode LCE1.

Referring to FIGS. 8 to 10, the circuit board 200 may include the plurality of bumps CAM1, CAM2, and CAM3. For example, the circuit board 200 may include the first bump CAM1 in contact with the first pad PD1, the second bump CAM2 in contact with the second pad PD2, and the third pad PD3 in contact with the third bump CAM3.

The plurality of bumps CAM1, CAM2, and CAM3 may be arranged in the first direction DR1 on the first to third pads PD1, PD2, and PD3. The plurality of bumps CAM1, CAM2, and CAM3 may be attached to the first to third pads PD1, PD2, and PD3, respectively, using an adhesive member, such as an anisotropic conductive film or an anisotropic conductive paste.

In the display device 10, the circuit board 200 and the display driving circuit 300 may be located on the first surface FS of the substrate SUB by arranging the first to third pads PD1, PD2, and PD3 on the first surface FS of the substrate SUB. That is, the circuit board 200 and the display driving circuit 300 may be located on the same surface as the first surface FS of the substrate SUB on which the thin film transistor layer TFTL and the light-emitting element LE are located, and they are connected through the connecting electrodes, so that a separate side surface line or a flexible film that is bent may be eliminated. Accordingly, a bezel-less display device may be implemented and, at the same time, the process efficiency and the yield of the display device 10 may be improved, because the rear surface process and the side surface process are not performed.

Further, the light-emitting element LE of the display device 10 according to one or more embodiments is located at a position lower than the top surface of the thin film transistor layer TFTL, that is, adjacent to the substrate SUB, so that the interference with the circuit board 200 and the display driving circuit 300 located on the same surface of the substrate SUB may be reduced or prevented. Accordingly, the thickness of the display panel 100 may be reduced or minimized.

Figure 11:
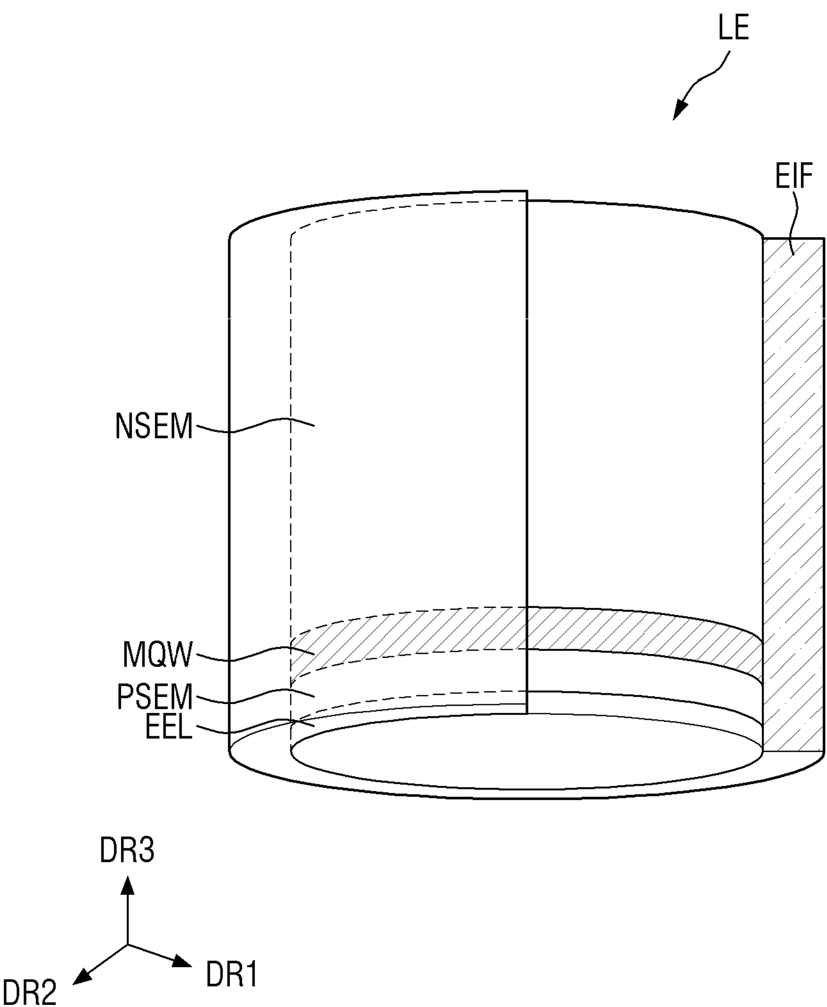
FIG. 11 is a schematic perspective view of a light-emitting element according to one or more embodiments.

FIG. 11 is a schematic perspective view of a light-emitting element according to one or more embodiments.

Referring to FIG. 11, the light-emitting element LE, which is a particulate element, may have a rod or cylindrical shape having an aspect ratio (e.g., a predetermined aspect ratio). The light-emitting element LE may have a size of a nanometer scale (equal to or greater than about 1 nm and less than about 1 μm) to a micrometer scale (equal to or greater than about 1 μm and less than about 1 mm). In one or more embodiments, both the diameter and the length of the light-emitting element LE may be on a nanometer scale, or on a micrometer scale. In some other embodiments, the diameter of the light-emitting element LE may be on a nanometer scale, while the length of the light-emitting element LE may be on a micrometer scale. In some embodiments, some of the light-emitting elements LE may have a diameter and/or length on a nanometer scale, while some others of the light-emitting elements LE may have a diameter and/or length on a micrometer scale.

The light-emitting element LE may include an inorganic light-emitting diode. The inorganic light-emitting diode of the light-emitting element LE may include a plurality of semiconductors. For example, the inorganic light-emitting diode of the light-emitting element LE may include a first conductivity type semiconductor (for example, a p-type semiconductor) PSEM, a second conductivity type semiconductor (for example, an n-type semiconductor) NSEM, and an active semiconductor (for example, an active layer) MQW interposed therebetween.

In one or more embodiments, the above-described semiconductors may be stacked along the third direction DR3. For example, as shown in FIG. 11, the light-emitting element LE may include the p-type semiconductor PSEM, the active layer MQW, and the n-type semiconductor NSEM that are sequentially stacked. However, the present disclosure is not limited thereto, and the n-type semiconductor NSEM, the active layer MQW, and the p-type semiconductor PSEM may be stacked in that order.

The p-type semiconductor PSEM may be doped with a first conductivity type dopant. The first conductivity type dopant may be Mg, Zn, Ca, Se, Ba, or the like. In one or more embodiments, the p-type semiconductor PSEM may be p-GaN doped with p-type Mg.

The n-type semiconductor NSEM may be spaced apart from the p-type semiconductor PSEM with the active layer MQW interposed therebetween. The n-type semiconductor NSEM may be doped with a second conductivity type dopant. The second conductivity type dopant may be Si, Ge, Sn, or the like. In one or more embodiments, the n-type semiconductor NSEM may be n-GaN doped with n-type Si.

The active layer MQW may include a material having a single or multiple-quantum-well structure. The active layer MQW may receive holes and electrons from the p-type semiconductor PSEM and the n-type semiconductor NSEM, respectively, and the holes and electrons that have reached the active layer MQW may be coupled with each other to emit light. That is, the active layer MQW may emit light by coupling of hole-electron pairs according to an electrical signal applied through the p-type semiconductor PSEM and the n-type semiconductor NSEM.

In some embodiments, the active layer MQW may have a structure in which semiconductor materials having large band gap energy and semiconductor materials having small band gap energy are alternately stacked, and may include other Group III to Group V semiconductor materials according to the wavelength band of the emitted light.

The light emitted from the active layer MQW may be projected through both side surfaces as well as the outer surface of the light-emitting element LE in the longitudinal direction. That is, the directionality of light emitted from the active layer MQW is not limited to one direction.

The light-emitting element LE may further include the electrode layer EEL and the element-insulating film EIF.

The electrode layer EEL may be located under the p-type semiconductor PSEM. The electrode layer EEL may be in contact with the p-type semiconductor PSEM. The electrode layer EEL may be an ohmic contact electrode. However, the electrode layer EEL is not limited thereto, and may be a Schottky contact electrode.

The electrode layer EEL may be located between the p-type semiconductor PSEM and the contact electrode, and may serve to reduce resistance when both ends of the light-emitting element LE and the contact electrode are electrically connected to apply an electrical signal to the p-type semiconductor PSEM and the n-type semiconductor NSEM. For example, the contact electrode may be an anode electrode or a cathode electrode.

The electrode layer EEL may include at least one of aluminum (Al), titanium (Ti), indium (In), gold (Au), silver (Ag), indium tin oxide (ITO), indium zinc oxide (IZO), and/or indium tin zinc oxide (ITZO). The electrode layer EEL may include an n-type or p-type doped semiconductor material.

The light-emitting element LE may further include the element-insulating film EIF surrounding the outer circumferential surfaces of the electrode layer EEL, the p-type semiconductor PSEM, the active layer MQW, and the n-type semiconductor NSEM. The element-insulating film EIF may surround at least the outer surface of the active layer MQW, and may extend in one direction in which the light-emitting element LE extends. The element-insulating film EIF may function to protect the members. Because the element-insulating film EIF is made of materials having insulating properties, it is possible to reduce or prevent the likelihood of an electrical short circuit that may occur when the active layer MQW directly contacts an electrode through which an electric signal is transmitted to the light-emitting element LE. Further, because the element-insulating film EIF protects the outer circumferential surfaces of the p-type semiconductor PSEM and the n-type semiconductor NSEM as well as the active layer MQW, a decrease in the luminous efficiency may be reduced or prevented.

Hereinafter, a method of manufacturing a display device according to one or more embodiments will be described.

FIGS. 12 to 22 are cross-sectional views sequentially showing a part of one sub-pixel in a method of fabricating a display device according to one or more embodiments.

Figure 12:
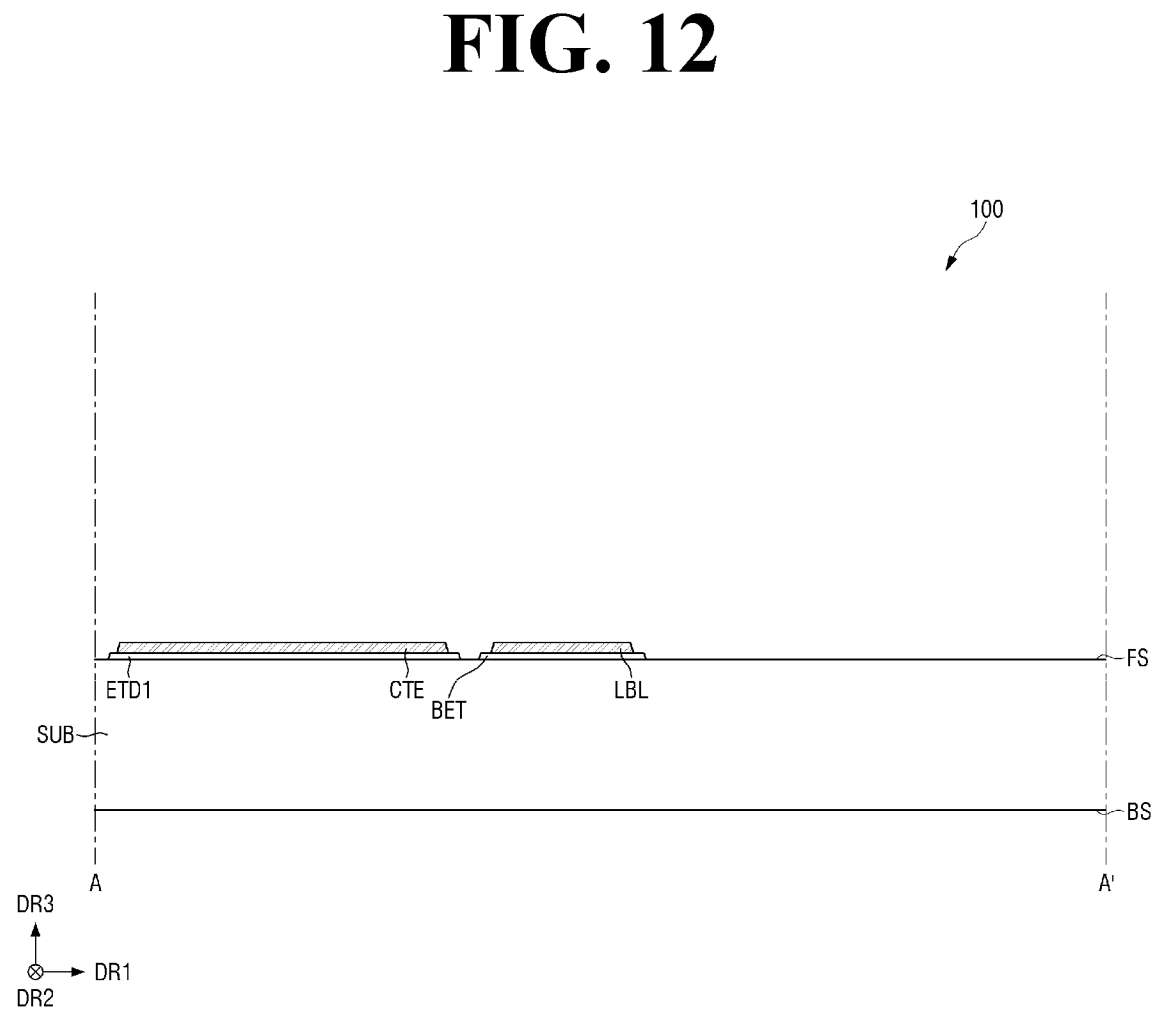

First, referring to FIG. 12, the first conductive layer CDL including the first electrode ETD1 and the first lower metal BET may be formed on the first surface FS of the substrate SUB by a photolithography process. The first conductive layer CDL may be made of a transparent conductive oxide, such as indium tin oxide (ITO) and indium zinc oxide (IZO).

Then, the lower metal layer BML including the contact electrode CTE and the light-blocking layer LBL may be formed by a photolithography process. The lower metal layer BML may be formed as a single layer or as multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Figure 13:
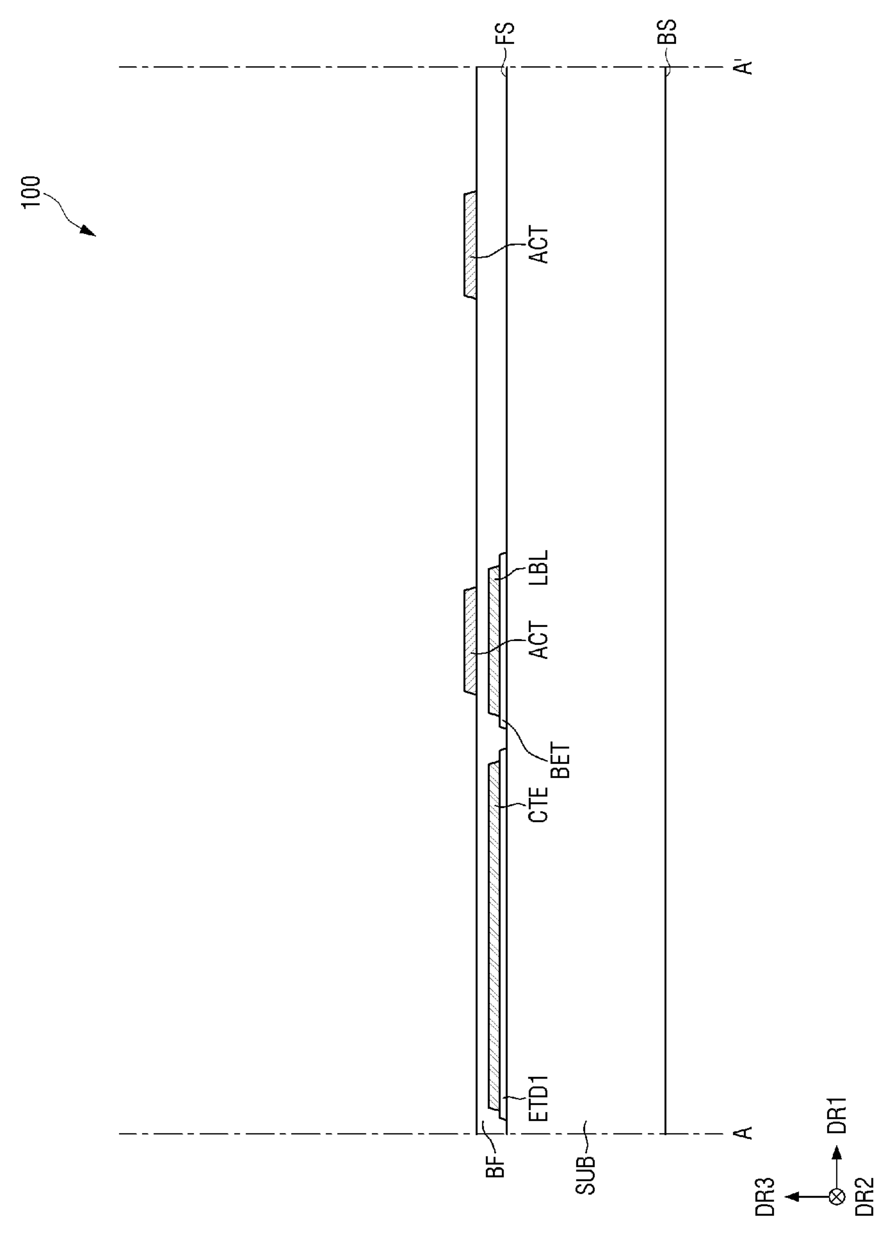

Next, referring to FIG. 13, the buffer layer BF may be formed on the first conductive layer CDL, the lower metal layer BML, and one surface of, or portions of, the substrate SUB. The buffer layer BF may be formed of multiple layers in which one or more inorganic layers of a silicon nitride layer, a silicon oxynitride layer, a silicon oxide layer, a titanium oxide layer, and/or an aluminum oxide layer are alternately stacked.

Then, the semiconductor layer ACT may be formed on the buffer layer BF. The semiconductor layer ACT may include a silicon semiconductor, such as polycrystalline silicon, monocrystalline silicon, low-temperature polycrystalline silicon, and amorphous silicon, or an oxide semiconductor.

Figure 14:
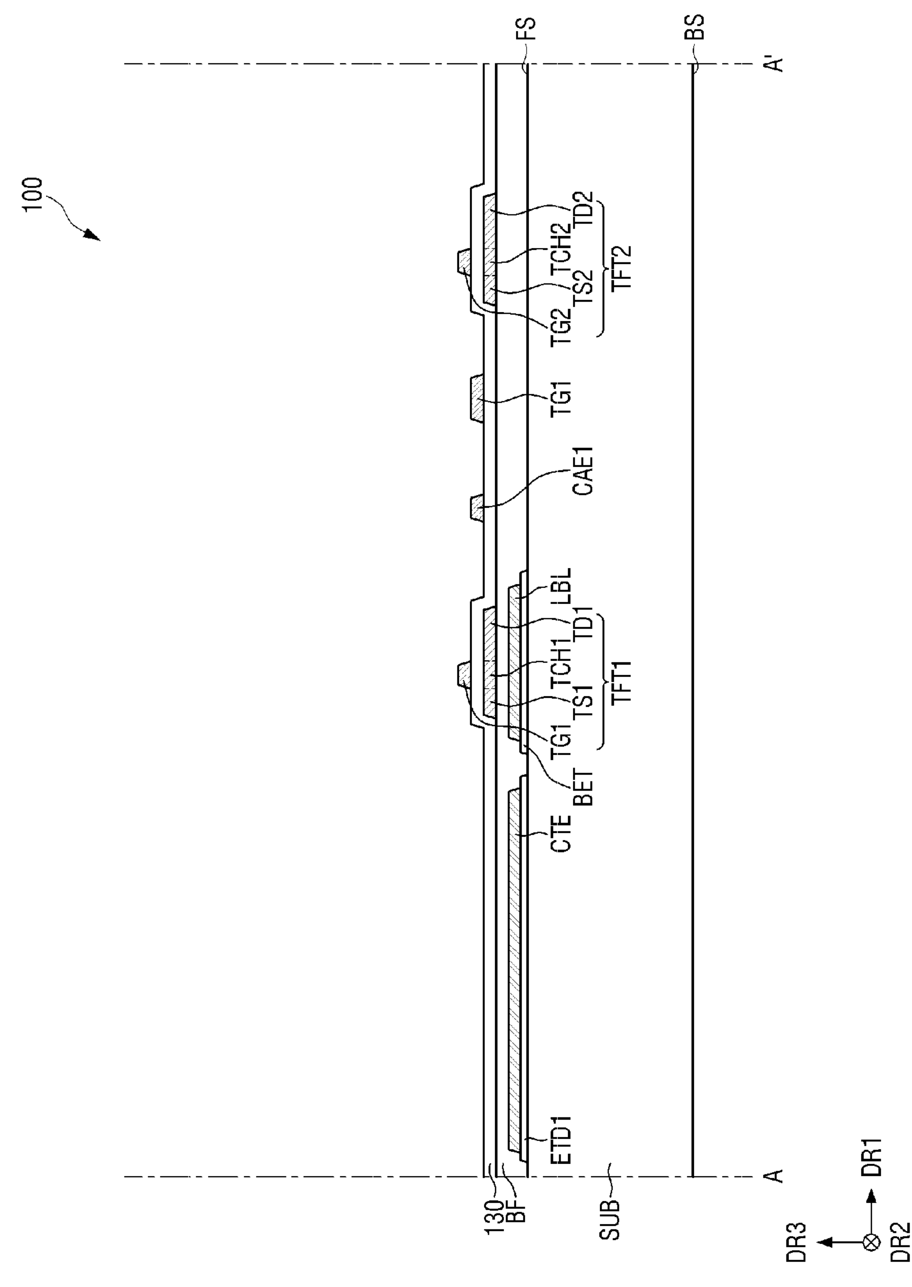

Next, referring to FIG. 14, the gate-insulating layer 130 covering the semiconductor layer ACT may be formed. The gate-insulating layer 130 may be formed of an inorganic layer, for example, a silicon nitride layer, a silicon oxynitride layer, a silicon oxide layer, a titanium oxide layer, or an aluminum oxide layer.

Then, the first gate layer GTL1 including the first gate electrode TG1 of the first thin film transistor TFT1, the first capacitor electrode CAE1 of the capacitor Cst, and the second gate electrode TG2 of the second thin film transistor TFT2 may be formed on the gate-insulating layer 130 by a photolithography process. The first gate layer GTL1 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Then, ions or impurities may be doped into the semiconductor layer ACT of the first thin film transistor TFT1 and the second transistor TFT2 using the first gate layer GTL1 as a mask. Accordingly, the first source electrode TS1 and the first drain electrode TD1 of the first thin film transistor TFT1 may have conductivity, and the second source electrode TS2 and the second drain electrode TD2 of the second thin film transistor TFT2 may have conductivity.

Figure 15:
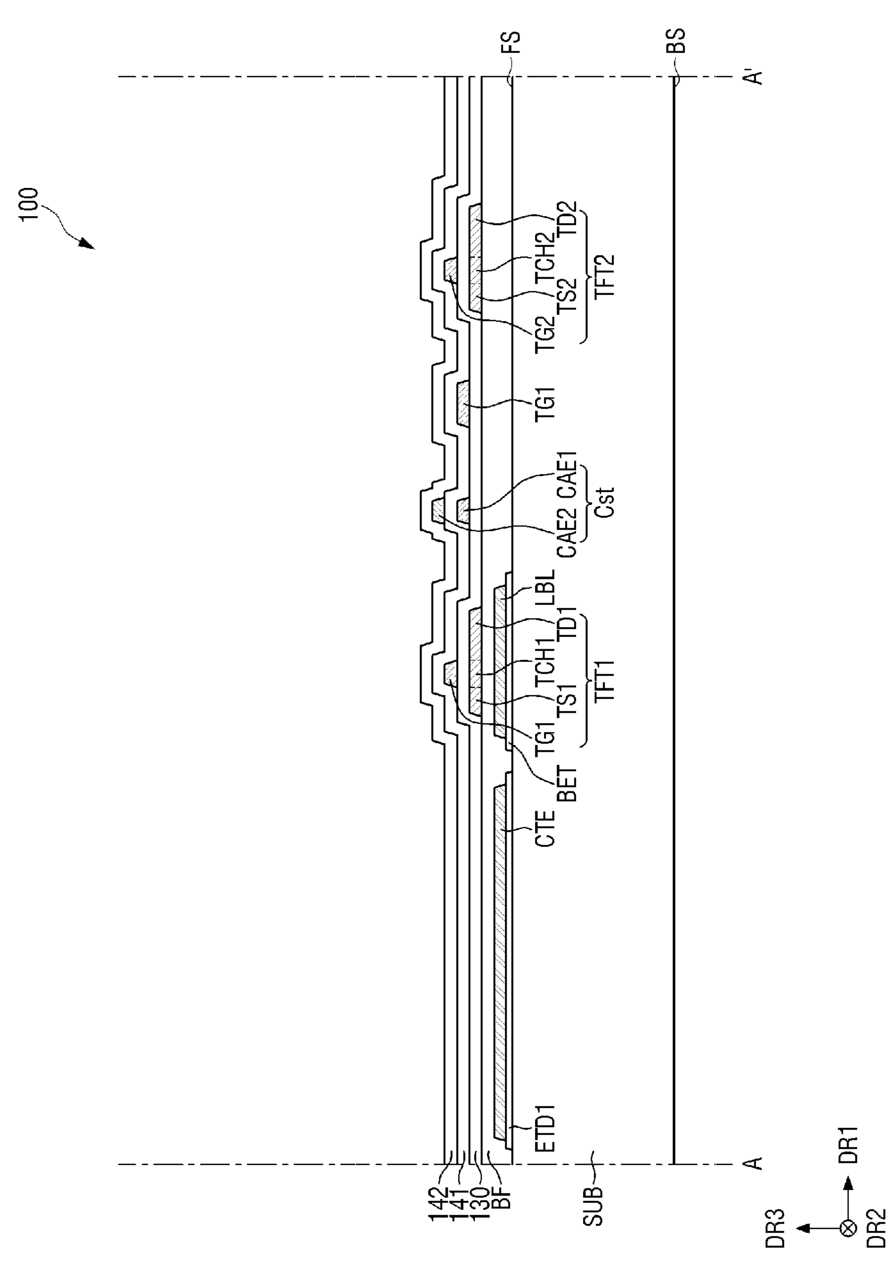

Next, referring to FIG. 15, the first interlayer insulating layer 141 covering the first gate layer GTL1 may be formed. The first interlayer insulating layer 141 may be formed of an inorganic layer, for example, a silicon nitride layer, a silicon oxynitride layer, a silicon oxide layer, a titanium oxide layer, or an aluminum oxide layer.

Then, the second gate layer GTL2 including the second capacitor electrode CAE2 of the capacitor Cst may be formed on the first interlayer insulating layer 141 by a photolithography process. The second gate layer GTL2 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Then, the second interlayer insulating layer 142 covering the second gate layer GTL2 may be formed. The second interlayer insulating layer 142 may be formed of an inorganic layer, for example, a silicon nitride layer, a silicon oxynitride layer, a silicon oxide layer, a titanium oxide layer, or an aluminum oxide layer.

Figure 16:
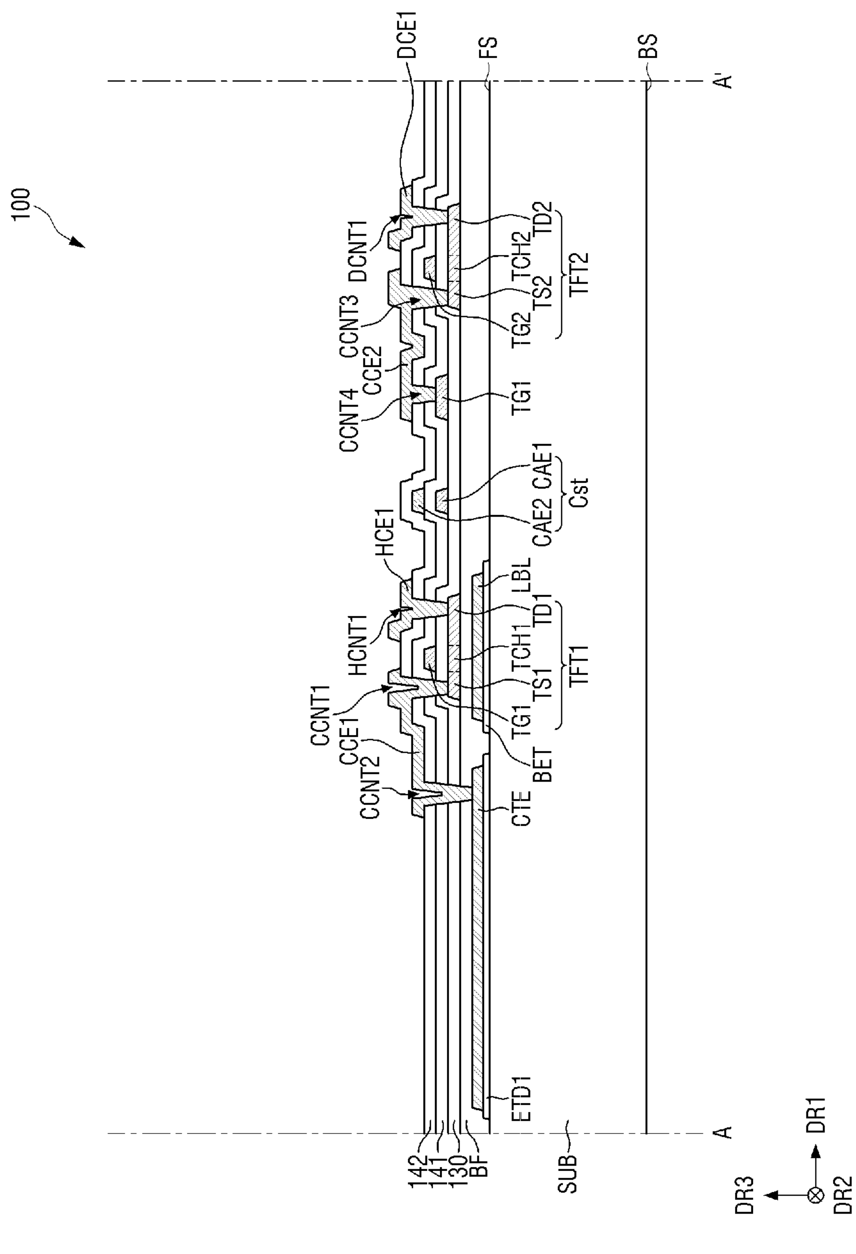

Next, referring to FIG. 16, the buffer layer BF, the gate-insulating layer 130, the first interlayer insulating layer 141, and the second interlayer insulating layer 142 may be etched to form the first contact holes CCNT1, CCNT2, HCNT1, CCNT3, CCNT4, and DCNT1.

Then, the first data metal layer DTL1 including the first connection electrodes CCE1, HCE1, CCE2, and DCE1 may be formed on the second interlayer insulating layer 142 by a photolithography process. The first data metal layer DTL1 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Figure 17:
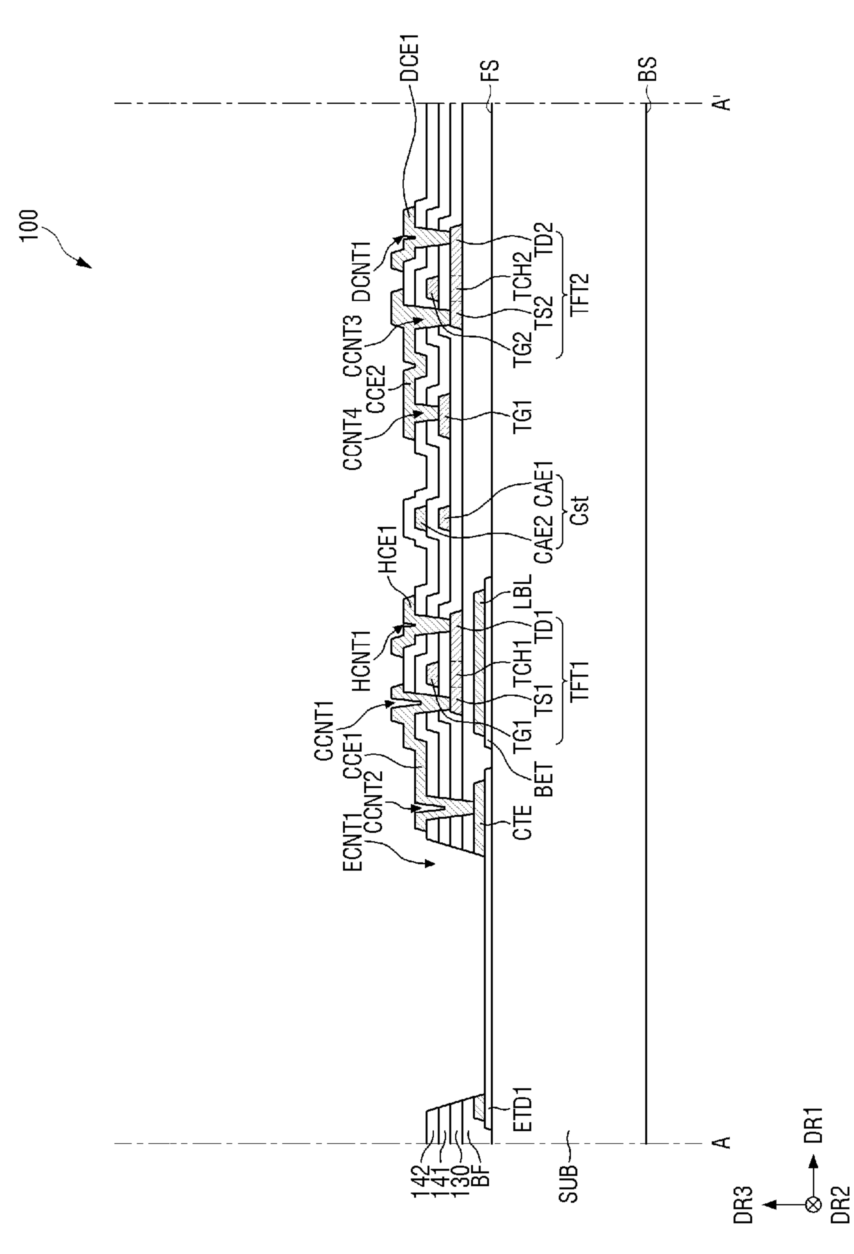

Next, referring to FIG. 17, the contact electrode CTE, the buffer layer BF, the gate-insulating layer 130, the first interlayer insulating layer 141, and the second interlayer insulating layer 142 may be etched to form the element contact hole ECNT1.

Figure 18:
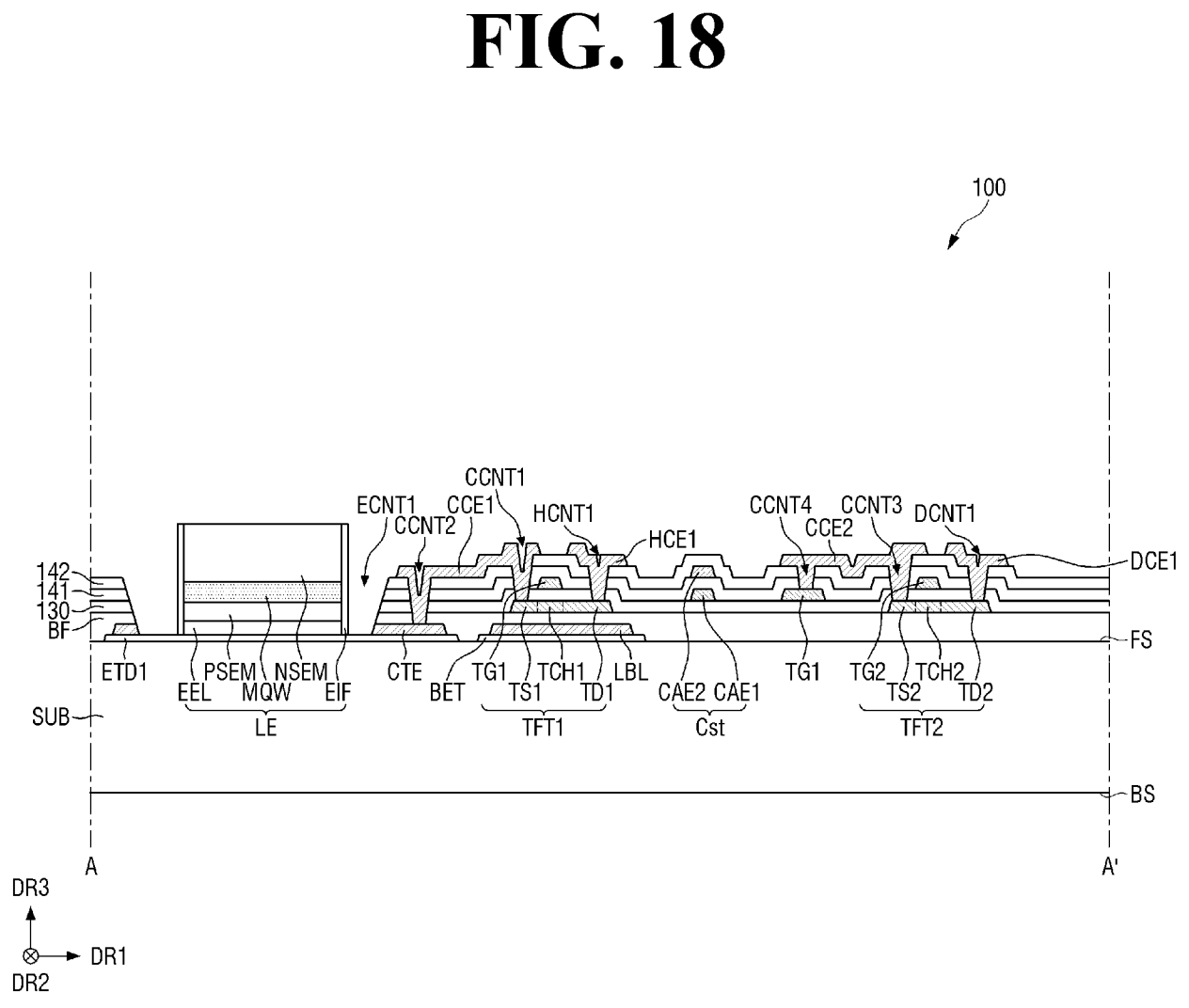

Next, referring to FIG. 18, the light-emitting elements LE may be located on the first electrode ETD1. The light-emitting elements LE may be formed by growing on a semiconductor substrate, such as a silicon wafer. Each of the light-emitting elements LE may be directly transferred from a silicon wafer onto the first electrode ETD1 of the substrate SUB. Alternatively, each of the light-emitting elements LE may be transferred onto the first electrode ETD1 of the substrate SUB through an electrostatic method using an electrostatic head or a stamping method using an elastic polymer material, such as PDMS or silicon as a transfer substrate.

Figure 19:
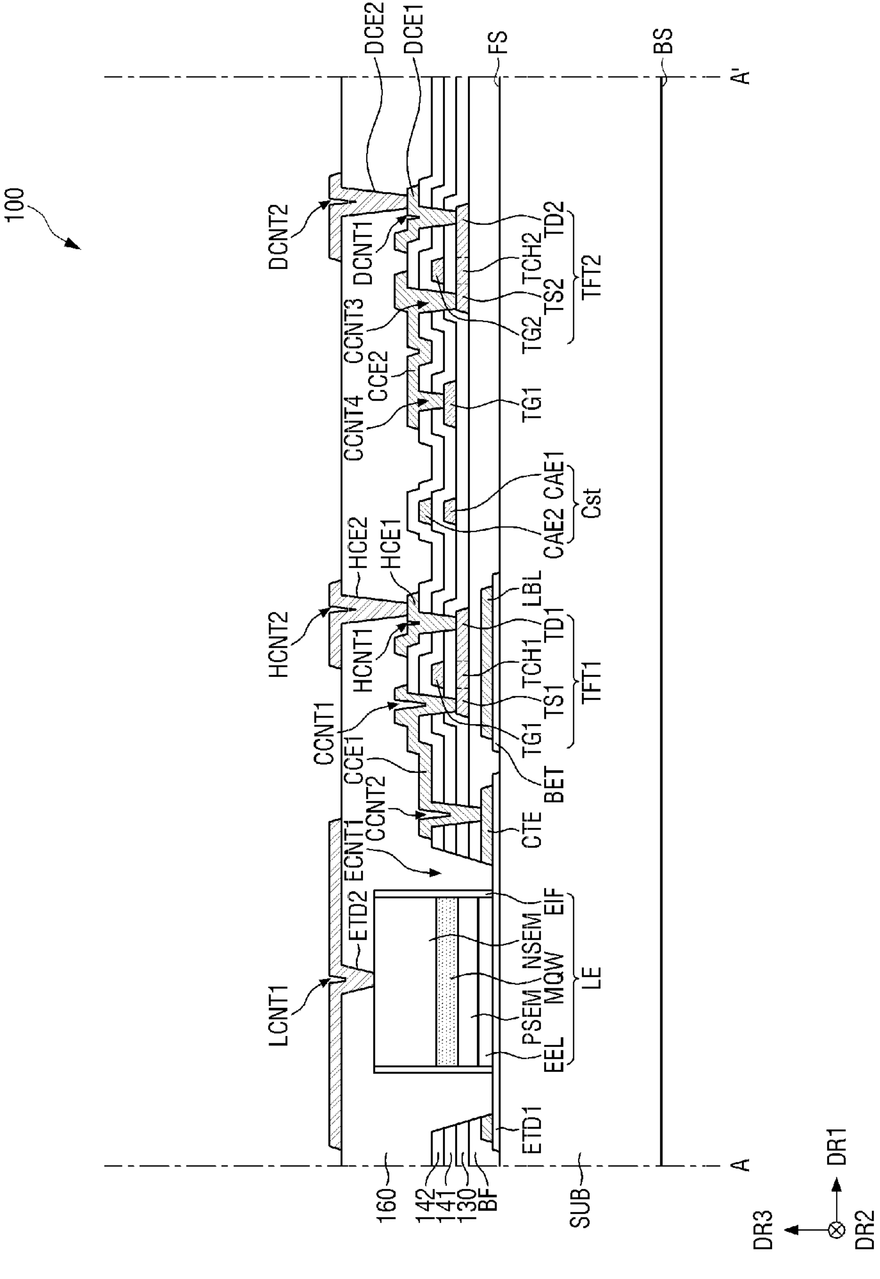

Next, referring to FIG. 19, the first planarization layer 160 covering the first data metal layer DTL1 may be formed. The first planarization layer 160 may be formed of an organic layer, such as acryl resin, epoxy resin, phenolic resin, polyamide resin, polyimide resin and/or the like.

Then, the first planarization layer 160 may be etched to form the second contact holes LCNT1, HCNT2, and DCNT2 exposing the light-emitting element LE and the first connection electrodes HCE1 and DCE1.

Then, the second data metal layer DTL2 including the second electrode ETD2 and the second connection electrodes HCE2 and DCE2 may be formed on the first planarization layer 160 by a photolithography process. The second electrode ETD2 and the second connection electrodes HCE2 and DCE2 may be connected to the light-emitting element LE and the first connection electrodes HCE1 and DCE1 through the second contact holes LCNT1, HCNT2 and DCNT2, respectively. The second data metal layer DTL2 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

As mentioned above, in some embodiments, the second electrode ETD2 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd), and copper (Cu).

Figure 20:
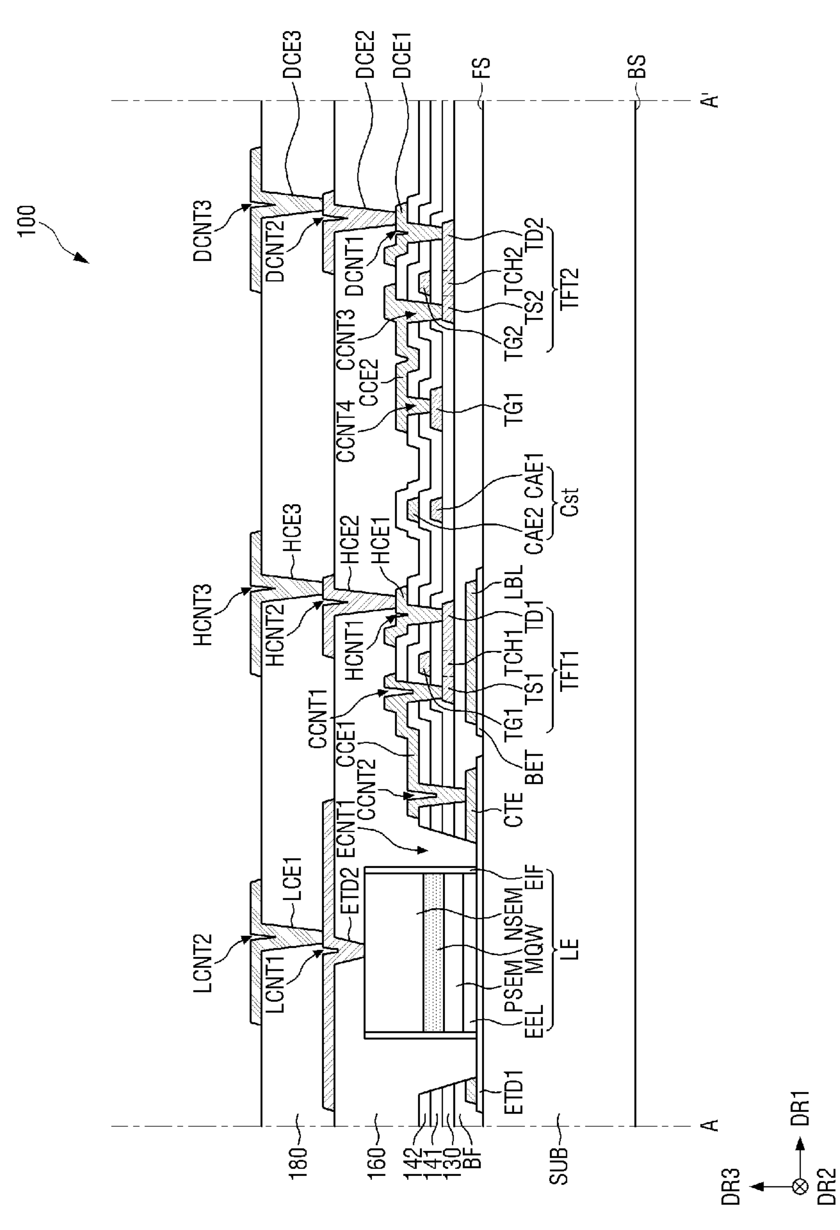

Next, referring to FIG. 20, the second planarization layer 180 covering the second data metal layer DTL2 may be formed. The second planarization layer 180 may be formed of an organic layer, such as acryl resin, epoxy resin, phenolic resin, polyamide resin, polyimide resin and/or the like.

Then, the second planarization layer 180 may be etched to form the third contact holes LCNT2, HCNT3, and DCNT3 exposing the second electrode ETD2 and the second connection electrodes HCE2 and DCE2.

Then, the third data metal layer DTL3 including the third connection electrodes LCE1, HCE3, and DCE3 may be formed on the second planarization layer 180 by a photolithography process. The third connection electrodes LCE1, HCE3, and DCE3 may be connected to the second electrode ETD2 and the second connection electrodes HCE2 and DCE2 through the third contact holes LCNT2, HCNT3, and DCNT3, respectively. The third data metal layer DTL3 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Figure 21:
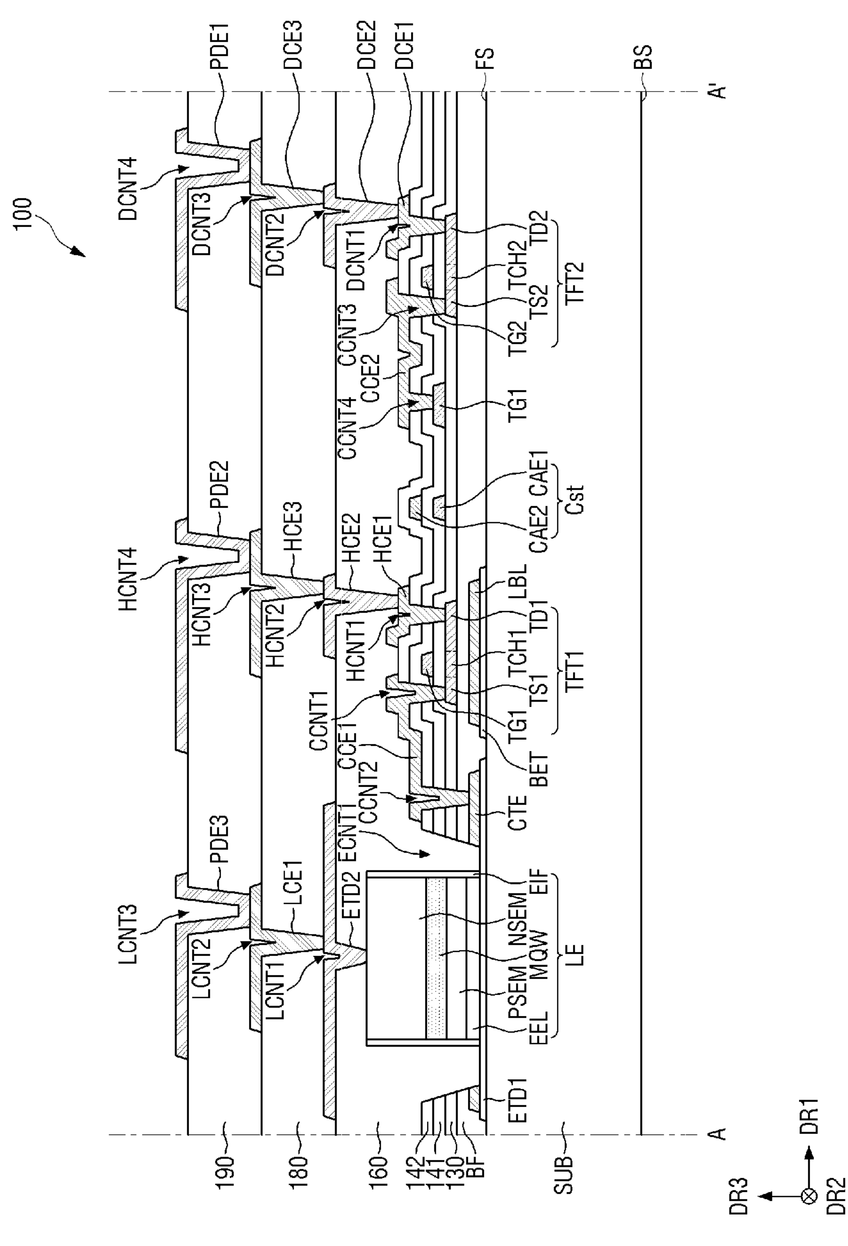

Next, referring to FIG. 21, the third planarization layer 190 covering the third data metal layer DTL3 may be formed. The third planarization layer 190 may be formed of an organic layer, such as acryl resin, epoxy resin, phenolic resin, polyamide resin, polyimide resin and/or the like.

Then, the third planarization layer 190 may be etched to form the fourth contact holes DCNT4, HCNT4, and LCNT3 exposing the third connection electrodes LCE1, HCE3, and DCE3.

Then, the fourth data metal layer DTL4 including the first to third pad electrodes PDE1, PDE2, and PDE3 may be formed on the third planarization layer 190 by a photolithography process. The first to third pad electrodes PDE1, PDE2, and PDE3 may be connected to the third connection electrodes DCE3, HCE3, and LCE1 through the fourth contact holes DCNT4, HCNT4, and LCNT3, respectively. The fourth data metal layer DTL4 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Figure 22:
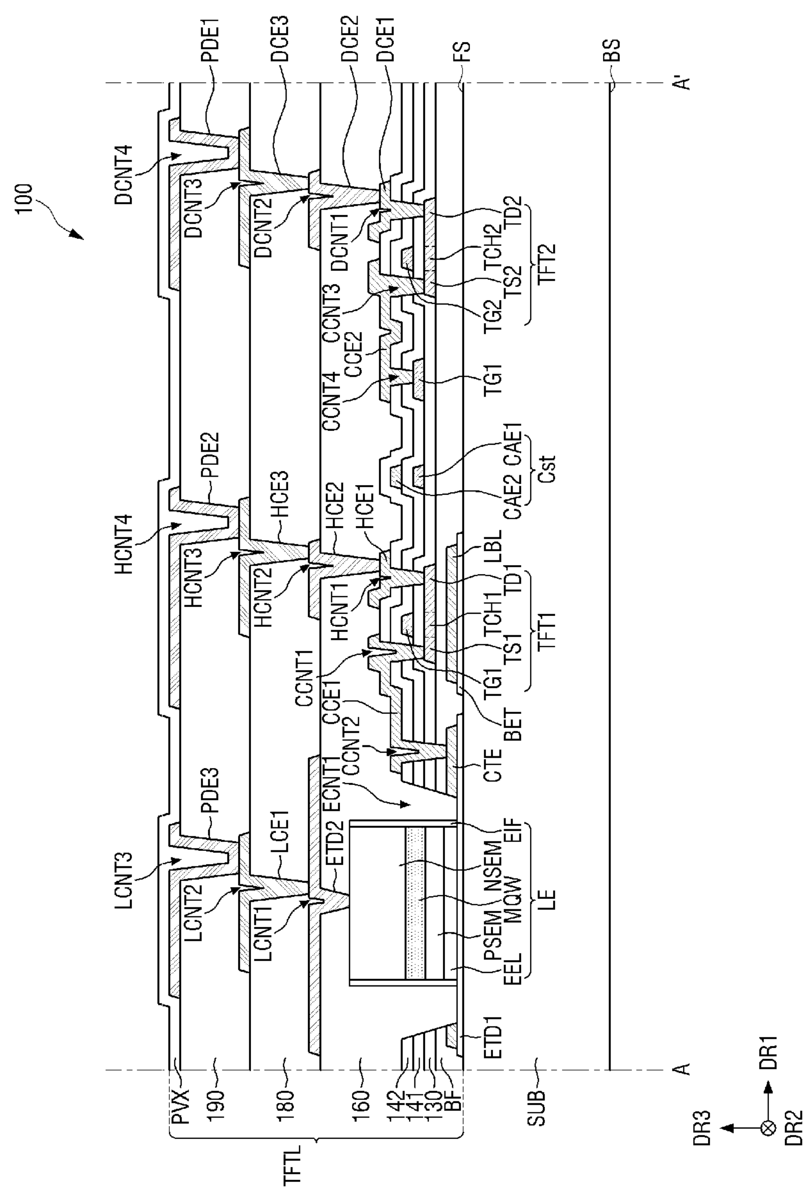

Referring to FIG. 22, the passivation layer PVX covering the fourth data metal layer DTL4 may be formed. The passivation layer PVX may be formed of an inorganic layer, for example, a silicon nitride layer, a silicon oxynitride layer, a silicon oxide layer, a titanium oxide layer, or an aluminum oxide layer.

Figure 23:
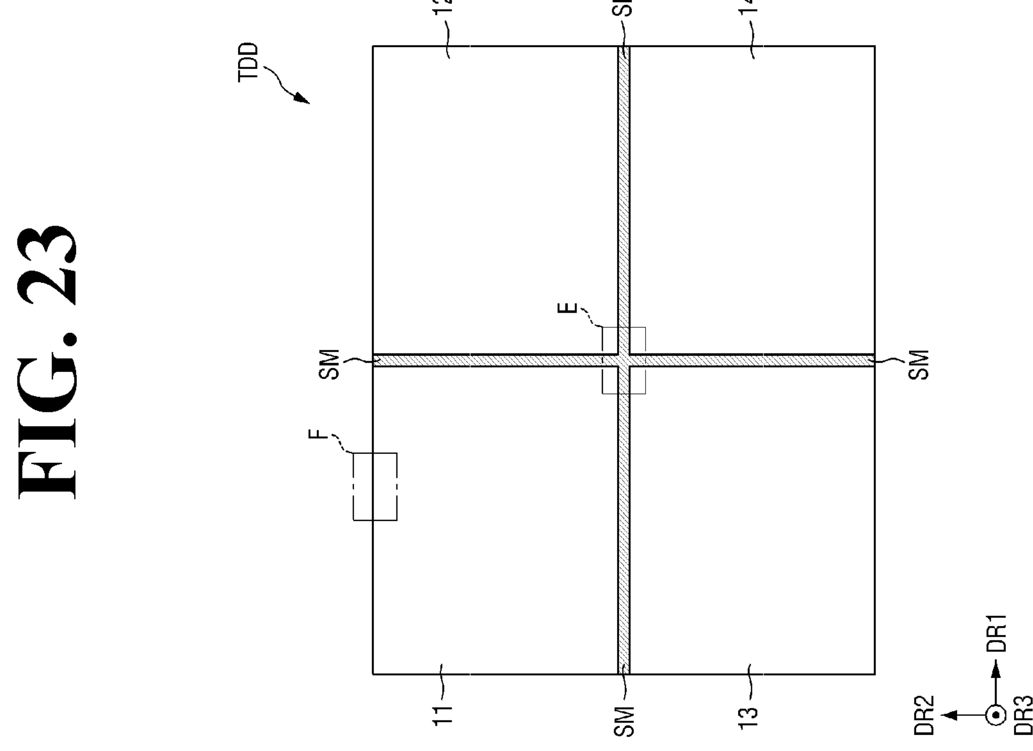
FIG. 23 is a plan view illustrating a tiled display device according to one or more embodiments.

FIG. 23 is a plan view illustrating a tiled display device according to one or more embodiments.

Referring to FIG. 23, a tiled display device TDD may include a plurality of display devices 11, 12, 13, and 14, and a seam SM. For example, the tiled display device TDD may include the first display device 11, the second display device 12, the third display device 13, and the fourth display device 14.

The plurality of display devices 11, 12, 13, and 14 may be arranged in a grid shape. The plurality of display devices 11, 12, 13, and 14 may be arranged in a matrix form in M (M being a natural number) rows and N (N being a natural number) columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TDD are not limited to those illustrated in FIG. 23. The number and arrangement of the display devices 11, 12, 13, and 14 in the tiled display device TDD may be determined by the sizes of the display device 10 and the tiled display device TDD and the shape of the tiled display device TDD.

The plurality of display devices 11, 12, 13, and 14 may have the same size, but the present disclosure is not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be located such that respective long sides or respective short sides thereof are connected to each other. Some or all of the plurality of display devices 11, 12, 13, and 14 may be located at the edge of the tiled display device TDD, and may form one side of the tiled display device TDD. At least one of the plurality of display devices 11, 12, 13, and/or 14 may be located at at least one corner of the tiled display device TDD, and may form two adjacent sides of the tiled display device TDD. At least one of the plurality of display devices 11, 12, 13, and/or 14 may be surrounded by other display devices.

Because each of the plurality of display devices 11, 12, 13, and 14 may be substantially the same as the display device 10 described with reference to FIG. 1 and/or the like, the description of each of the plurality of display devices 11, 12, 13, and 14 will be omitted.

The seam SM may include a coupling member or an adhesive member. In this case, the plurality of display devices 11, 12, 13, and 14 may be connected to each other by the coupling member or the adhesive member of the seam SM. The seam SM may be located between the first display device 11 and the second display device 12, between the first display device 11 and the third display device 13, between the second display device 12 and the fourth display device 14, and between the third display device 13 and the fourth display device 14.

Figure 24:
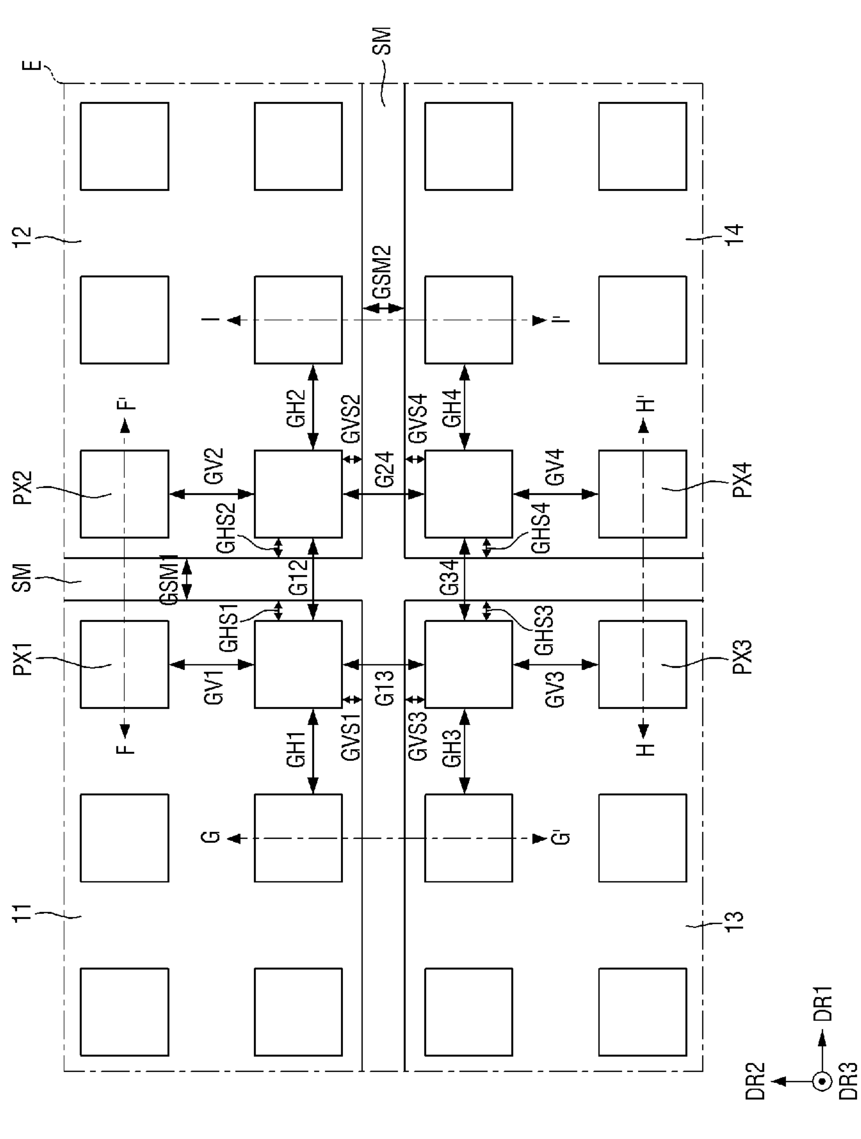
FIG. 24 is an enlarged layout view illustrating area E of FIG. 23 in detail.

FIG. 24 is an enlarged layout view illustrating area E of FIG. 23 in detail.

Referring to FIG. 24, the seam SM may have a planar shape of a cross, or of a plus sign, at the central region of the tiled display device TDD where the first display device 11, the second display device 12, the third display device 13, and the fourth display device 14 are adjacent to each other. The seam SM may be located between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix form in the first direction DR1 and the second direction DR2 to display an image. The third display device 13 may include third pixels PX3 arranged in a matrix form in the first direction DR1 and the second direction DR2 to display an image. The fourth display device 14 may include fourth pixels PX4 arranged in a matrix form in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The seam SM may be located between the first pixel PX1 and the second pixel PX2 adjacent in the first direction DR1. A minimum distance G12 between the first pixel PX1 and the second pixel PX2 adjacent in the first direction DR1 may be the sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the seam SM in the first direction DR1 may be less than the first horizontal separation distance GH1, and the minimum distance GHS2 between the second pixel PX2 and the seam SM in the first direction DR1 may be less than the second horizontal separation distance GH2. In addition, the width GSM1 of the seam SM in the first direction DR1 may be less than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The seam SM may be located between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam SM in the first direction DR1 may be less than the third horizontal separation distance GH3, and the minimum distance GHS4 between the fourth pixel PX4 and the seam SM in the first direction DR1 may be less than the fourth horizontal separation distance GH4. In addition, the width GSM1 of the seam SM in the first direction DR1 may be less than the third horizontal separation distance GH3 or the fourth horizontal separation distance GH4.

A minimum distance between the first pixels PX1 adjacent in the second direction DR2 may be defined as a first vertical separation distance GV1, and a minimum distance between the third pixels PX3 adjacent in the second direction DR2 may be defined as a third vertical separation distance GV3. The first vertical separation distance GV1 and the third vertical separation distance GV3 may be substantially the same.

The seam SM may be located between the first pixel PX1 and the third pixel PX3 adjacent in the second direction DR2. A minimum distance G13 between the first pixel PX1 and the third pixel PX3 adjacent in the second direction DR2 may be the sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the seam SM in the second direction DR2 may be less than the first vertical separation distance GV1, and the minimum distance GVS3 between the third pixel PX3 and the seam SM in the second direction DR2 may be less than the third vertical separation distance GV3. In addition, the width GSM2 of the seam SM in the second direction DR2 may be less than the first vertical separation distance GV1 or the third vertical separation distance GV3.

A minimum distance between the second pixels PX2 adjacent in the second direction DR2 may be defined as a second vertical separation distance GV2, and a minimum distance between the fourth pixels PX4 adjacent in the second direction DR2 may be defined as a fourth vertical separation distance GV4. The second vertical separation distance GV2 and the fourth vertical separation distance GV4 may be substantially the same.

The seam SM may be located between the second pixel PX2 and the fourth pixel PX4 adjacent in the second direction DR2. A minimum distance G24 between the second pixel PX2 and the fourth pixel PX4 adjacent in the second direction DR2 may be the sum of a minimum distance GVS2 between the second pixel PX2 and the seam SM in the second direction DR2, a minimum distance GVS4 between the fourth pixel PX4 and the seam SM in the second direction DR2, and the width GSM2 of the seam SM in the second direction DR2.

The minimum distance G24 between the second pixel PX2 and the fourth pixel PX4 adjacent in the second direction DR2, the second vertical separation distance GV2, and the fourth vertical separation distance GV4 may be substantially the same. To this end, the minimum distance GVS2 between the second pixel PX2 and the seam SM in the second direction DR2 may be less than the second vertical separation distance GV2, and the minimum distance GVS4 between the fourth pixel PX4 and the seam SM in the second direction DR2 may be less than the fourth vertical separation distance GV4. In addition, the width GSM2 of the seam SM in the second direction DR2 may be less than the second vertical separation distance GV2 or the fourth vertical separation distance GV4.

As shown in FIG. 24, the minimum distance between pixels of adjacent display devices may be substantially the same as the minimum distance between pixels of each of the display devices to reduce or prevent the likelihood of the seam SM being visually recognized between the images displayed by the plurality of display devices 11, 12, 13, and 14.

Figure 25:
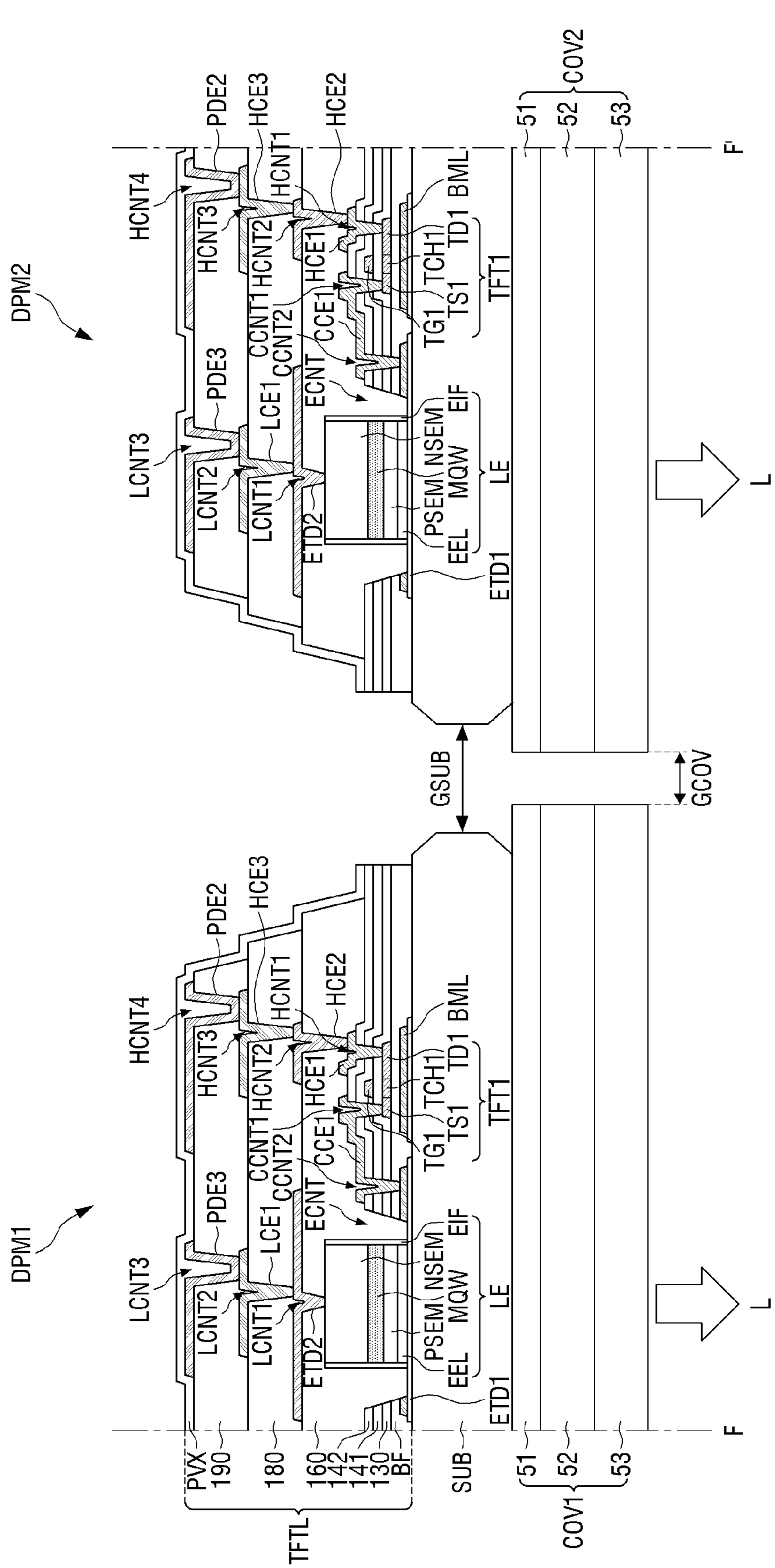
FIG. 25 is a cross-sectional view illustrating an example of a tiled display device taken along the line F-F' of FIG. 22.

FIG. 25 is a cross-sectional view illustrating an example of a tiled display device taken along the line F-F' of FIG. 22.

Referring to FIG. 25, the first display device 11 may include a first display module DPM1 and a first cover COV1. The second display device 12 may include a second display module DPM2 and a second cover COV2. The first cover COV1 and the second cover COV2 may be optical members.

Each of the first display module DPM1 and the second display module DPM2 may include the substrate SUB, the thin film transistor layer TFTL, and the light-emitting elements LE. The thin film transistor layer TFTL and the light-emitting element layer LE have already been described in detail with reference to FIG. 5. In the description of FIG. 25, redundant description of the parts already described with respect to FIG. 5 will be omitted.

The substrate SUB may include a first surface on which the thin film transistor layer TFTL is located, a second surface opposite to the first surface, and a first side surface located between the first surface and the second surface. The first surface may be the front surface or the top surface of the substrate SUB, and the second surface may be the rear surface or the bottom surface of the substrate SUB. The substrate SUB may further include the first chamfered surface located between the first surface and the first side surface, and the second chamfered surface located between the second surface and the first side surface.

The first cover COV1 and the second cover COV2 may be located on the second surface BS of the substrate SUB. That is, the first cover COV1 and the second cover COV2 may be located under the substrate SUB. The first cover COV1 and the second cover COV2 may protrude beyond the substrate SUB in the first direction DR1. Therefore, a gap GSUB between the substrate SUB of the first display device 11 and the substrate SUB of the second display device 12 may be greater than a gap GCOV between the first cover COV1 and the second cover COV2.

Each of the first cover COV1 and the second cover COV2 may include an adhesive member 51, a light transmittance control layer 52 located below the adhesive member 51, and an anti-glare layer 53 located below the light transmittance control layer 52.

The adhesive member 51 of the first cover COV1 may serve to attach the substrate SUB of the first display module DPM1 to the first cover COV1. The adhesive member 51 may be a transparent adhesive member capable of transmitting light. For example, the adhesive member 51 may be an optically clear adhesive film or an optically clear resin.

The light transmittance control layer 52 may be designed to reduce the transmittance of the external light or light reflected from the first display module DPM1 and the second display module DPM2. Accordingly, the likelihood of the gap GSUB between the substrate SUB of the first display module DPM1 and the substrate SUB of the second display module DPM2 being visually recognized from the outside may be reduced or prevented.

The anti-glare layer 53 may be designed to diffusely reflect external light to reduce or prevent the visibility of an image deteriorated due to the external light being reflected. Accordingly, the contrast ratio of images displayed by the first display device 11 and the second display device 12 may be increased due to the anti-glare layer 53. The anti-glare layer 53 may be implemented as a polarizing plate, and the light transmittance control layer 52 may be implemented as a phase delay layer, but the present disclosure is not limited thereto.

Because the second cover COV2 may have substantially the same configuration as that of the first cover COV1, the detailed description thereof will be omitted.

Meanwhile, an example of a tiled display device taken along the line G-G', along the line H-H', and along the line I-I' of FIG. 24 is substantially the same as an example of a tiled display device taken along the line E-E' described in conjunction with FIG. 25, so that description thereof will be omitted.

Figure 26:
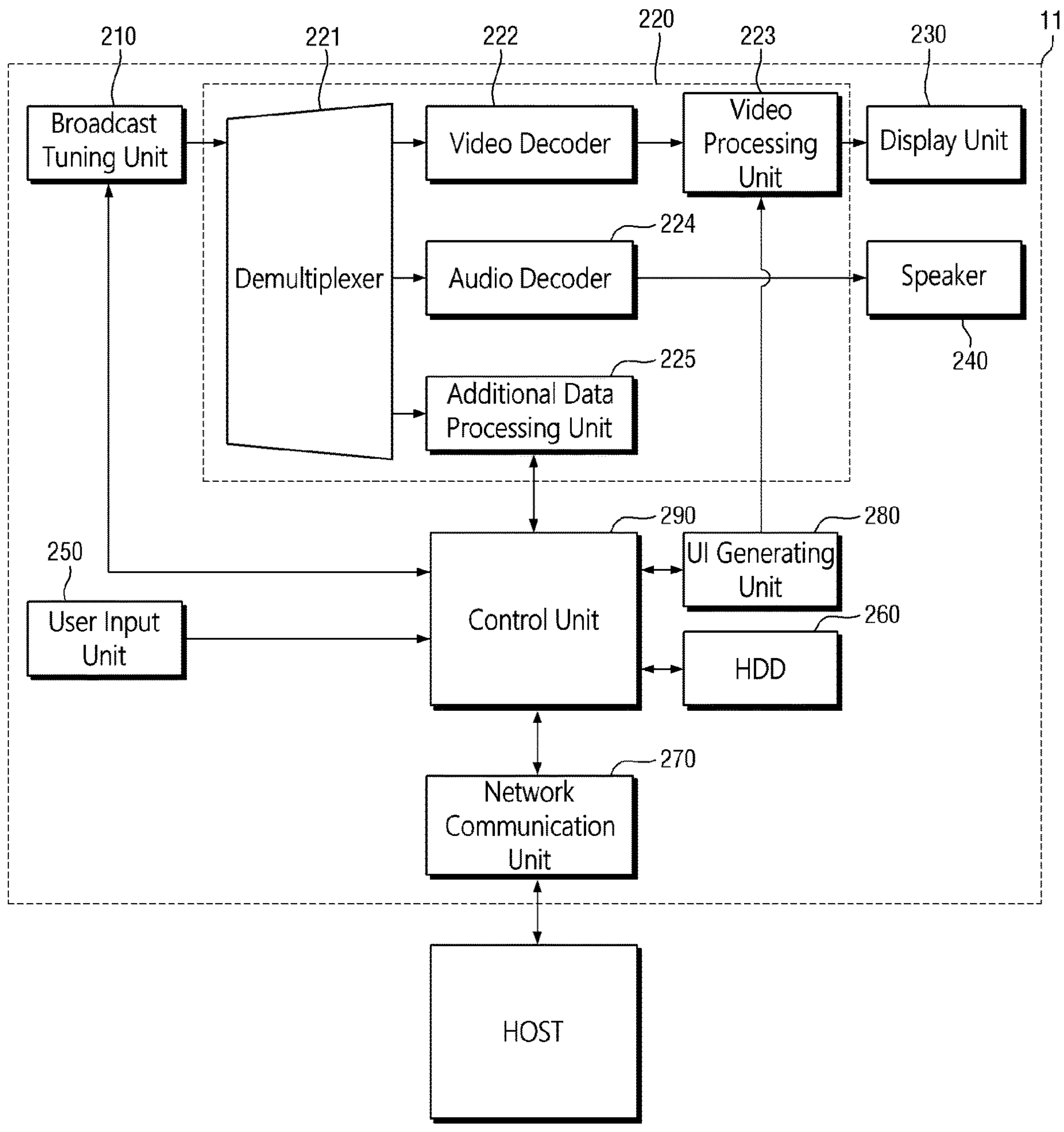
FIG. 26 is a block diagram illustrating a tiled display device according to one or more embodiments.

FIG. 26 is a block diagram illustrating a tiled display device according to one or more embodiments. FIG. 26 illustrates the first display device 11 and a host system HOST for simplicity of description.

Referring to FIG. 26, the tiled display device TDD according to one or more embodiments may include the host system HOST, a broadcast tuner (e.g., broadcast tuning unit) 210, a signal processor 220, a display (e.g., display unit) 230, a speaker 240, a user input (e.g., user input unit) 250, an HDD 260, a network communicator (e.g., network communication unit) 270, a UI generator 280, and a controller 290.

The host system HOST may be implemented as any one of a television system, a home theater system, a set-top box, a navigation system, a DVD player, a Blu-ray player, a personal computer (PC), a mobile phone system, and/or a tablet.

A user's command may be inputted to the host system HOST in various formats. For example, a command by a user's touch input may be inputted to the host system HOST. Alternatively, a user's command by a keyboard input or a button input of a remote controller may be inputted to the host system HOST.

The host system HOST may receive original video data corresponding to the original image from the outside. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image to correspond to the first display device 11, the second display device, the third display device, and the fourth display device. The host system HOST may transmit the first video data to the first display device 11, transmit the second video data to the second display device, transmit the third video data to the third display device, and transmit the fourth video data to the fourth display device.

The first display device 11 may display a first image according to the first video data, the second display device may display a second image according to the second video data, the third display device may display a third image according to the third video data, and the fourth display device may display a fourth image according to the fourth video data. Accordingly, the user may view the original image in which the first to fourth images displayed on the first to fourth display devices are combined.

The first display device 11 may include the broadcast tuner 210, the signal processor 220, the display 230, the speaker 240, the user input 250, the HDD 260, the network communicator 270, the UI generator 280, and the controller 290.

The broadcast tuner 210 may tune a channel frequency (e.g., a predetermined channel frequency) under the control of the controller 290 to receive a broadcast signal of the corresponding channel through an antenna. The broadcast tuner 210 may include a channel detection module and an RF demodulation module.

The broadcast signal demodulated by the broadcast tuner 210 is processed by the signal processor 220 and outputted to the display 230 and the speaker 240. Here, the signal processor 220 may include a demultiplexer 221, a video decoder 222, a video processor 223, an audio decoder 224, and an additional data processor 225.

The demultiplexer 221 separates the demodulated broadcast signal into a video signal, an audio signal, and additional data. The separated video signal, audio signal, and additional data are restored by the video decoder 222, the audio decoder 224, and the additional data processor 225, respectively. In this case, the video decoder 222, the audio decoder 224, and the additional data processor 225 restore them in a decoding format corresponding to an encoding format at the time of transmitting a broadcast signal.

Meanwhile, the decoded video signal is converted by the video processor 223 to have a vertical frequency, a resolution, an aspect ratio, and/or the like suitable for the output standard of the display 230, and the decoded audio signal is outputted to the speaker 240.

The display 230 includes a display panel 100 on which an image is displayed and a panel driver for controlling driving of the display panel 100.

The user input 250 may receive the signal transmitted by the host system HOST. The user input 250 may be provided to allow a user to select a command related to communication with other display devices as well as data related to selection of a channel transmitted by the host system HOST and selection and manipulation of a user interface (UI) menu, and to input the input data.

The HDD 260 stores various software programs including OS programs, recorded broadcast programs, videos, photos, and other data, and may be formed of a storage medium, such as a hard disk or non-volatile memory.

The network communicator 270, which is used for short-distance communication with the host system HOST and other display devices, may be implemented as a communication module including an antenna pattern capable of implementing mobile communication, data communication, Bluetooth, RF, Ethernet, or the like.

The network communicator 270 may transmit/receive a wireless signal with at least one of a base station, an external terminal, or a server on a mobile communication network constructed based on technical standards or communication methods (e.g., global system for mobile communication (GSM), code division multi access (CDMA), code division multi access (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, or the like) for mobile communication through an antenna pattern to be described later.

The network communicator 270 may transmit/receive a wireless signal in a communication network according to wireless Internet technologies through an antenna pattern to be described later. Examples of the wireless internet techniques include wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and/or the like. The antenna pattern transmits and receives data according to at least one of wireless internet techniques including even internet techniques not listed above.

The UI generator 280, which generates a UI menu for communication with the host system HOST and other display devices, may be implemented by an algorithm code and an OSD IC. The UI menu for communication with the host system HOST and other display devices may be a menu for designating a counterpart digital TV for communication and selecting a desired function.

The controller 290, which is responsible for overall control of the first display device 11 and communication control of the host system HOST and the second to fourth display devices, may be implemented by a micro controller unit (MCU) in which the corresponding algorithm code for control is stored and the stored algorithm code is executed.

The controller 290 transmits the corresponding control command and data to the host system HOST and the second to fourth display devices through the network communicator 270 in response to the input and selection of the user input 250. When receiving a control command (e.g., predetermined control command) and data from the host system HOST and the second to fourth display devices, the controller 290 performs an operation according to the corresponding control command.

In concluding the detailed description, those skilled in the art will appreciate that many variations and modifications can be made to the embodiments without substantially departing from the aspects of the present disclosure. Therefore, the disclosed embodiments are used in a generic and descriptive sense only and not for purposes of limitation.

What is claimed is:

1. A display device comprising:
a substrate;
a first electrode above one surface of the substrate;
a contact electrode above the first electrode, and contacting the first electrode;
a buffer layer above the contact electrode;
an active layer of a thin film transistor above the buffer layer;
a gate-insulating layer above the active layer;
a gate electrode of the thin film transistor above the gate-insulating layer; and
a light-emitting element above the first electrode, and in an element contact hole penetrating and defined by the contact electrode, the buffer layer, and the gate-insulating layer, collectively.

2. A display device comprising:
a substrate;
a first electrode above one surface of the substrate;
a contact electrode above the first electrode, and contacting the first electrode;
a buffer layer above the contact electrode;
an active layer of a thin film transistor above the buffer layer;
a gate-insulating layer above the active layer;
a gate electrode of the thin film transistor above the gate-insulating layer;
a light-emitting element above the first electrode, and in an element contact hole penetrating the contact electrode, the buffer layer, and the gate-insulating layer;
a first interlayer insulating layer above the gate electrode; and
a first data conductive layer above the first interlayer insulating layer, and comprising a first connection electrode connected to the active layer through a first contact hole penetrating the first interlayer insulating layer and the gate-insulating layer, and connected to the contact electrode through a second contact hole penetrating the first interlayer insulating layer and the gate-insulating layer,
wherein the element contact hole further penetrates the first interlayer insulating layer.

3. The display device of claim 2, further comprising:
a first planarization layer above the first data conductive layer; and
a second data conductive layer above the first planarization layer, and comprising a second electrode,
wherein the light-emitting element contacts the first electrode and the second electrode.

4. The display device of claim 3, wherein the light-emitting element comprises a first type semiconductor above the first electrode and contacting the first electrode, an active layer above the first type semiconductor, and a second type semiconductor above the active layer and contacting the second electrode.

5. The display device of claim 4, wherein a minimum distance between the active layer and the substrate in a thickness direction of the substrate is less than a minimum distance between the first data conductive layer and the substrate in the thickness direction of the substrate.

6. The display device of claim 3, wherein a width of the second electrode is greater than a width of the element contact hole.

7. The display device of claim 3, further comprising:
a second planarization layer above the second data conductive layer;
a third data conductive layer above the second planarization layer, and comprising a first pad electrode penetrating the second planarization layer; and
a circuit board above the substrate, and electrically connected to the second electrode through the first pad electrode.

8. The display device of claim 7, wherein the first data conductive layer further comprises a second connection electrode penetrating the first interlayer insulating layer and the gate-insulating layer,
wherein the second data conductive layer further comprises a third connection electrode penetrating the first planarization layer,
wherein the third data conductive layer further comprises a second pad electrode penetrating the second planarization layer, and
wherein the circuit board is electrically connected to the active layer through the second connection electrode, the third connection electrode, and the second pad electrode.

9. The display device of claim 8, wherein the first pad electrode is configured to receive a low potential voltage from the circuit board, and
wherein the second pad electrode is configured to receive a high potential voltage from the circuit board.

10. The display device of claim 2, wherein a minimum distance between a top surface of the light-emitting element and the substrate in a thickness direction of the substrate is greater than a minimum distance between a top surface of the first data conductive layer and the substrate in the thickness direction.

11. The display device of claim 2, wherein at least a part of the light-emitting element is at a same level as at least one of the first data conductive layer, the gate electrode, or the active layer.

12. The display device of claim 1, wherein an entirety of a bottom surface of the light-emitting element contacts the first electrode.

13. The display device of claim 1, wherein the first electrode comprises a transparent conductive material, and
wherein the contact electrode comprises an opaque conductive material.

14. The display device of claim 1, wherein a thickness of the contact electrode is greater than a thickness of the first electrode.

15. The display device of claim 1, wherein the light-emitting element is configured to emit light onto another surface of the substrate as a display surface.

16. The display device of claim 1, wherein the light-emitting element comprises a vertical micro light-emitting diode.

17. A tiled display device comprising:
display devices; and
a seam between the display devices,
wherein, among the display devices, a first display device comprises:
a substrate;
a first electrode above one surface of the substrate;
a contact electrode above the first electrode, and contacting the first electrode;
a buffer layer above the contact electrode;
an active layer of a thin film transistor above the buffer layer;
a gate-insulating layer above the active layer;

a gate electrode of the thin film transistor above the gate-insulating layer; and a light-emitting element above the first electrode, and in an element contact hole penetrating the contact electrode, the buffer layer, and the gate-insulating layer.

18. The tiled display device of claim 17, wherein the first display device further comprises an optical member below another surface of the substrate.

19. The tiled display device of claim 17, wherein the light-emitting element comprises a vertical micro light-emitting diode.

20. The tiled display device of claim 17, wherein the display devices are arranged in a matrix form in M (M being a positive integer) rows and N (N being a positive integer) columns.

* * * * *